(12) United States Patent
Cho

(10) Patent No.: US 9,331,304 B2
(45) Date of Patent: May 3, 2016

(54) ORGANIC LIGHT-EMITTING DISPLAY DEVICE AND METHOD OF MANUFACTURING THE SAME

(71) Applicant: Samsung Display Co., Ltd., Yongin, Gyeonggi-Do (KR)

(72) Inventor: Sung Ho Cho, Seochu-gu (KR)

(73) Assignee: Samsung Display Co., Ltd., Yogin, Gyeonggi-do (KR)

( * ) Notice: Subject to any disclaimer, the term of this patent is extended or adjusted under 35 U.S.C. 154(b) by 249 days.

(21) Appl. No.: 13/970,270

(22) Filed: Aug. 19, 2013

(65) Prior Publication Data

US 2014/0346445 A1    Nov. 27, 2014

(30) Foreign Application Priority Data

May 21, 2013    (KR) .................. 10-2013-0057195

(51) Int. Cl.
| | | |
|---|---|---|
| H01L 21/00 | (2006.01) | |
| H01L 51/52 | (2006.01) | |
| H01L 51/56 | (2006.01) | |
| H01L 27/32 | (2006.01) | |

(52) U.S. Cl.
CPC ......... H01L 51/5246 (2013.01); *H01L 27/3244* (2013.01); *H01L 51/56* (2013.01)

(58) Field of Classification Search
CPC .. H01L 51/5237; H01L 51/56; H01L 27/3258
See application file for complete search history.

(56) References Cited

U.S. PATENT DOCUMENTS

| | | | |
|---|---|---|---|
| 8,067,883 B2 | 11/2011 | Wang | |
| 2007/0188079 A1* | 8/2007 | Song et al. | .................... 313/504 |

FOREIGN PATENT DOCUMENTS

| | | |
|---|---|---|
| KR | 10-2004-0080522 | 9/2004 |
| KR | 10-2007-0014316 | 2/2007 |
| KR | 10-2011-0092582 | 8/2011 |

* cited by examiner

*Primary Examiner* — Laura Menz
(74) *Attorney, Agent, or Firm* — Knobbe, Martens, Olson & Bear LLP

(57) ABSTRACT

An organic light-emitting display device and a method of manufacturing the same are disclosed. The organic light-emitting display device (OLED) may include a first substrate with an element region and an encapsulation region surrounding the element region, a second substrate facing the first substrate, an organic light-emitting element interposed between the first substrate and the second substrate and formed in the element region, and an encapsulant interposed between the first substrate and the second substrate and formed in the encapsulation region. The encapsulant may include both a first encapsulant and a second encapsulant. The second encapsulant formed within the first encapsulant and is adjacent to at least one of the first substrate and the second substrate.

10 Claims, 26 Drawing Sheets

ORGANIC LIGHT-EMITTING DISPLAY DEVICE AND METHOD OF MANUFACTURING THE SAME This application claims priority from Korean Patent Application No. 10-2013-0057195 filed on May 21, 2013 in the Korean Intellectual Property Office, the disclosure of which is incorporated herein by reference in its entirety.

BACKGROUND

1. Field

The present disclosure relates to an organic light-emitting display device and a method of manufacturing the same.

2. Description of the Related Technology

An organic light-emitting display device (OLED) is a display device that can display information such as images, text, etc. by using light generated when holes and electrons supplied respectively from an anode and a cathode combine in an organic layer interposed between the anode and the cathode. Display properties of such an OLED change sensitively to penetration of oxygen and moisture. Thus, encapsulation technology that can prevent penetration of oxygen and moisture is required. One example of a suitable material applicable to the encapsulation technology is glass frit. If edges of first and second substrates are sealed with the glass frit, it is possible to effectively prevent oxygen and moisture from penetrating into an organic light-emitting element and a thin-film transistor (TFT). However, the glass frit has low mechanical strength. That is, the glass frit is very vulnerable to external impact and vibrations. In particular, if a space between the first substrate and the second substrate is filled with nitrogen, since there is no layer for absorbing external impact and vibrations, the external impact and vibrations may be transmitted, as they are, to the glass frit, thus easily damaging the glass frit. When the glass frit that encapsulates the organic light-emitting element is damaged, oxygen and moisture may penetrate into the organic light-emitting element, thereby degrading display quality of the OLED. For example, a dark spot may be formed in a pixel adjacent to the damaged glass frit, and a developing dark spot defect in which the dark spot gradually spreads may occur.

SUMMARY OF CERTAIN INVENTIVE ASPECTS

In one aspect, an organic light-emitting display device (OLED) with consistent display quality and impact resistance is provided.

In another aspect, a method of manufacturing an OLED with consistent display quality and impact resistance is provided.

The above and other aspects of the present disclosure will become more apparent to one of ordinary skill in the art to which the present disclosure pertains by referencing the detailed description of the present disclosure given below.

In another aspect, an organic light-emitting display device (OLED) is provided. The OLED may include, for example, a first substrate having an element region and an encapsulation region surrounding the element region, a second substrate facing the first substrate, an organic light-emitting element interposed between the first substrate and the second substrate and formed in the element region, and an encapsulant interposed between the first substrate and the second substrate and formed in the encapsulation region.

In some embodiments, the encapsulant includes a first encapsulant and a second encapsulant. In some embodiments, the second encapsulant is formed within the first encapsulant and adjacent to at least one of the first substrate and the second substrate.

In another aspect, an organic light-emitting display device (OLED) is provided. The OLED may include, for example, a first substrate having an element region and an encapsulation region surrounding the element region, a second substrate facing the first substrate, an organic light-emitting element interposed between the first substrate and the second substrate and formed in the element region, and an encapsulant interposed between the first substrate and the second substrate and formed in the encapsulation region. In some embodiments, the encapsulant includes a metallic material formed in a shape spreading randomly in a direction away from the first substrate or the second substrate.

In another aspect a method of manufacturing an organic light-emitting display device (OLED) is provided. The method may include, for example, forming an organic light-emitting element on an element region of a first substrate, forming a metal pattern on an encapsulation region surrounding the element region, forming a glass frit pattern on a second substrate, and encapsulating the organic light-emitting element by bonding the metal pattern to the glass frit pattern.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF CERTAIN INVENTIVE EMBODIMENTS

Figure 1:
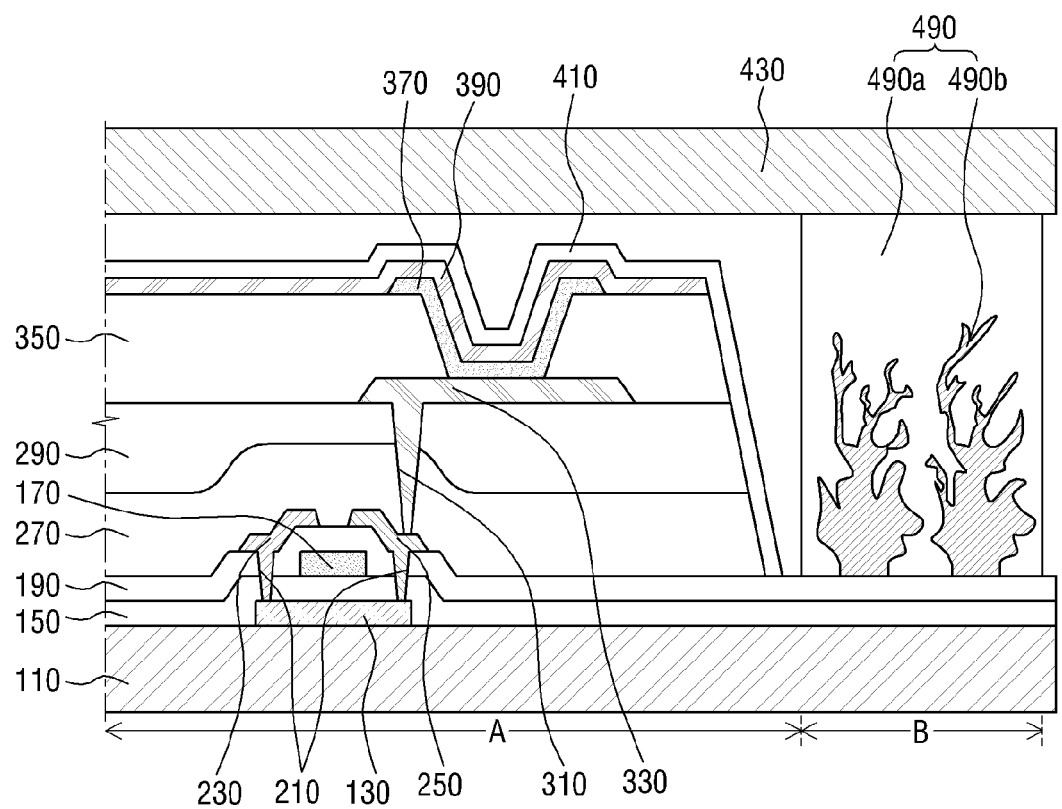
FIG. 1 is a cross-sectional view of an organic light-emitting display device (OLED) according to an embodiment of the present disclosure.

Advantages and features of the present disclosure and methods of accomplishing the same may be understood more readily by reference to the following detailed description of preferred embodiments and the accompanying drawings. The present disclosure may, however, be embodied in many different forms and should not be construed as being limited to the embodiments set forth herein. Rather, these embodiments are provided so the disclosure will fully convey the concept of the invention to those skilled in the art, and the present disclosure will only be defined by the appended claims. Thus, in some embodiments, well-known structures and devices are not shown in order not to obscure the description with unnecessary detail. Like numbers refer to like elements throughout. In the drawings, the thickness of layers and regions are exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments described herein will be described referring to plan views and/or cross-sectional views by way of ideal schematic views of the disclosure. Accordingly, the exemplary views may be modified depending on manufacturing technologies and/or tolerances. Therefore, the embodiments of the disclosure are not limited to those shown in the views, but include modifications in configuration formed on the basis of manufacturing processes. Therefore, regions exemplified in figures have schematic properties and shapes of regions shown in figures exemplify specific shapes of regions of elements and not limit aspects of the disclosure.

Hereinafter, embodiments of the present disclosure will be described with reference to the attached drawings.

FIG. 1 is a cross-sectional view of an organic light-emitting display device (OLED) according to an embodiment of the present disclosure. Referring to FIG. 1, the OLED according to the current embodiment may include a first substrate 110, a semiconductor pattern 130, a gate insulating layer 150, a gate electrode 170, an interlayer insulating film 190, contact holes 210, a source electrode 230, a drain electrode 250, an intermediate layer 270, a planarization layer 290, a via hole 310, a first electrode 330, a pixel defining layer 350, an organic light-emitting layer 370, a second electrode 390, a passivation layer 410, a second substrate 430, and an encapsulant 490. In the present description, an "OLED" will be described as an example. However, the present disclosure is not limited to the OLED. That is, a liquid crystal display (LCD), an electrophoretic display, a field emission display (FED), a surface-conduction electron-emitter display (SED), a plasma display, a cathode ray tube display, etc. can also be used.

The first substrate 110 may be shaped like a rectangular parallelepiped plate. A surface of the first substrate 110 may be flat, and various structures that constitute a display device may be formed on the flat surface. The first substrate 110 may include a transparent insulating substrate. For example, the first substrate 110 may be a glass substrate, a quartz substrate, a transparent resin substrate, etc. In some embodiments, the first substrate 110 may include a polymer with high thermal resistance. For example, the first substrate 110 may include at least one material selected from the group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate, cellulose acetate propionate (CAP), poly(aryleneether sulfone), and various combinations thereof. The first substrate 110 may have flexibility. That is, the first substrate 110 may be a deformable substrate that can be rolled, folded, bent, etc. The first substrate 110 may include an element region A and an encapsulation region B. The element region A may be a region where various elements for driving the OLED, such as organic light-emitting elements and thin-film transistors (TFTs), are located. In some embodiments, the element region A may be a region where images are displayed. The element region A may be located in the middle of the first substrate 110. The encapsulation region B may be a region where the encapsulant 490 for encapsulating various elements that drive the OLED is located. In some embodiments, the encapsulation region B may be adjacent to edges of the first substrate 110. That is, the encapsulation region B may be located in an edge portion of the first substrate 110. The encapsulation region B may surround the element region A.

In an exemplary embodiment, the encapsulation region B may be shaped like a quadrangular or circular donut surrounding all around the element region A.

Although not shown in the drawing, a buffer layer may be disposed on the first substrate 110. The buffer layer may prevent metallic atoms, impurities, etc. from diffusing from the first substrate 110. If the surface of the first substrate 110 is not even, the buffer layer may improve the flatness of the surface of the first substrate 110. The buffer layer may be formed of a silicon compound such as silicon oxide, silicon nitride, silicon oxynitride, silicon oxycarbide, silicon carbonitride, etc. These materials may be used alone or in various combinations thereof. In other exemplary embodiments, the buffer layer may have a single layer structure or a multilayer structure including a silicon compound. For example, the buffer layer may include a silicon oxide layer, a silicon nitride layer, a silicon oxynitride layer, a silicon oxycarbide layer, and/or a silicon carbonitride layer. The buffer layer can be omitted, depending on the surface flatness, material, etc. of the first substrate 110.

The semiconductor pattern 130 may be formed on the first substrate 110. In some embodiments, the semiconductor pattern 130 may be located on the element region A of the first substrate 110. If the buffer layer is present on the first substrate 110, the semiconductor pattern 130 may be formed on the buffer layer. The semiconductor pattern 130 may be formed of amorphous semiconductor, microcrystalline semiconductor, or polycrystalline semiconductor. Preferably, the semiconductor pattern 130 may be formed of polycrystalline semiconductor. The semiconductor pattern 130 may also be formed of oxide semiconductor. The semiconductor pattern 130 may include a channel portion undoped with impurities and p+-doped source and drain portions which are disposed on both sides of the channel portion. Here, an ion material used to dope the source and drain portions may be P-type impurities such as boron (B). For example, $B_2H_6$ may be used. The impurities may vary according to the type of a TFT.

The gate insulating layer 150 may be formed on the buffer layer to cover the semiconductor pattern 130. The gate insulating layer 150 may be formed in the element region A and the encapsulation region B of the first substrate 110. The gate insulating layer 150 may be formed of silicon oxide ($SiO_x$), silicon nitride ($SiN_x$), or metal oxide. Examples of the metal oxide that can be used in the gate insulating layer 150 may include hafnium oxide ($HfO_x$), aluminum oxide ($AlO_x$), zirconium oxide ($ZrO_x$), titanium oxide ($TiO_x$), and tantalum oxide ($TaO_x$). These materials may be used alone or in various combinations thereof. The gate insulating layer 150 may be formed on the buffer layer to a substantially uniform thickness along a profile of the semiconductor pattern 130. The gate insulating layer 150 may be relatively thin and may have a step portion formed adjacent to the semiconductor pattern 130. In other exemplary embodiments, the gate insulating layer 150 may have a substantially flat top surface while fully covering the semiconductor pattern 130. In this case, the gate insulating layer 150 may be relatively thick.

The gate electrode 170 may be formed on the gate insulating layer 150. The gate electrode 170 may be formed in the element region A of the first substrate 110. The gate electrode 170 may be formed on a portion of the gate insulating layer 150 under which the semiconductor pattern 130 is located. The gate electrode 170 may include a metal, an alloy, metal nitride, conductive metal oxide, a transparent conductive material, etc. In an example, the gate electrode 170 may include aluminum (Al), an alloy containing aluminum, aluminum nitride ($AlN_x$), silver (Ag), an alloy containing silver, tungsten (W), tungsten nitride ($WN_x$), copper (Cu), an alloy containing copper, nickel (Ni), chrome (Cr), chrome nitride ($CrO_x$), molybdenum (Mo), an alloy containing molybdenum, titanium (Ti), titanium nitride ($TiN_x$), platinum (Pt), tantalum (Ta), tantalum nitride ($TaN_x$), neodymium (Nd), scandium (Sc), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), etc. These materials may be used alone or in various combinations thereof. According to exemplary embodiments, the gate electrode 170 may have a single layer structure composed of the metal, the alloy, the metal nitride, the conductive metal oxide, or the transparent conductive material described above. Otherwise, the gate electrode 170 may have a multilayer structure composed of the metal, the alloy, the metal nitride, the conductive metal oxide, and/or the transparent conductive material. In exemplary embodiments, the gate electrode 170 may be substantially narrower than the semiconductor pattern 130. For example, a width of the gate electrode 170 may be substantially equal or similar to that of the channel portion. In some embodiments, the gate electrode 170 and the channel portion may overlap each other. However, the dimensions of the gate electrode 170 and/or the dimensions of the channel portion may vary according to electrical characteristics required of a switching element including the gate electrode 170 and the channel portion.

The interlayer insulating film 190 may be formed on the gate insulating layer 150 to cover the gate electrode 170. The interlayer insulating film 190 may be formed on the element region A and the encapsulation region B of the first substrate 110. The interlayer insulating film 190 may be formed on the gate insulating layer 150 to a substantially uniform thickness along a profile of the gate electrode 170. Therefore, the interlayer insulating film 190 may have a step portion formed adjacent to the gate electrode 170. The interlayer insulating film 190 may be formed of a silicon compound such as silicon oxide, silicon nitride, silicon oxynitride, silicon carbonitride, silicon oxycarbide, etc. These materials may be used alone or in various combinations thereof. In some embodiments, the interlayer insulating film 190 may have a single layer structure or a multilayer structure including silicon oxide, silicon nitride, silicon oxynitride, silicon carbonitride, silicon oxycarbide, etc. Further, the interlayer insulating film 190 may be formed of substantially the same material as the gate insulating layer 150. The interlayer insulating film 190 may insulate the gate electrode 170 from a source electrode 230 and a drain electrode 250 which will are generally formed later during the manufacturing process.

The interlayer insulating film 190 may include the contact holes 210 which partially expose the semiconductor pattern 130. The contact holes 210 may be formed on the element region A of the first substrate 110. In an exemplary embodiment, the contact holes 210 may expose the source portion and the drain portion of the semiconductor pattern 130. If the gate insulating layer 150 is disposed on the semiconductor pattern 130 as in the exemplary embodiment of FIG. 1, the contact holes 210 may penetrate through the gate insulating layer 150. The contact holes 21 may extend in a direction perpendicular to the surface of the first substrate 110.

The source electrode 230 and the drain electrode 250 may be formed on the interlayer insulating film 190. The source electrode 230 and the drain electrode 250 may be inserted into the contact holes 210, respectively. That is, the source electrode 230 and the drain electrode 250 may be formed on the element region A of the first substrate 110. The source electrode 230 and the drain electrode 250 may be separated by a predetermined distance with respect to the gate electrode 170 and may be disposed adjacent to the gate electrode 170. In some embodiments, the source electrode 230 and the drain electrode 250 may penetrate through the interlayer insulating film 190 and the gate electrode 150 to contact the source portion and the drain portion of the semiconductor pattern 130, respectively. Each of the source electrode 230 and the drain electrode 250 include a metal, an alloy, metal nitride, conductive metal oxide, a transparent conductive material, etc. In an example, each of the source electrode 230 and the drain electrode 250 may include aluminum, an alloy containing aluminum, aluminum nitride, silver, an alloy containing silver, tungsten, tungsten nitride, copper, an alloy containing copper, nickel, chrome, chrome nitride, molybdenum, an alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These materials may be used alone or in various combinations thereof. Each of the source electrode 230 and the drain electrode 250 may have a single layer structure or a multilayer structure composed of the metal, the alloy, the metal nitride, the conductive metal oxide, or the transparent conductive material described above. The formation of the source electrode 230 and the drain electrode 250 on the interlayer insulating film 190 may produce a TFT, which includes the semiconductor pattern 130, the gate insulating layer 150, the gate electrode 170, the source electrode 230 and the drain electrode 250, on the first substrate 110 as a switching element of the OLED. Here, the TFT may be a top gate TFT.

The intermediate layer 270 may be formed on the source electrode 230 and the drain electrode 250. That is, the intermediate layer 270 may be formed on the interlayer insulating film 190 to cover the source electrode 230 and the drain electrode 250. The intermediate layer 270 may be formed on the element region A of the first substrate 110. The intermediate layer 270 may be thick enough to completely cover the source electrode 230 and the drain electrode 250. The intermediate layer 270 may be formed of an organic material or an inorganic material. For example, the intermediate layer 270 may include photoresist, acrylic-based polymer, polyimide-based polymer, polyamide-based polymer, siloxane-based polymer, polymer containing photosensitive acryl carboxyl, novolak resin, alkali soluble resin, silicon oxide, silicon nitride, silicon oxynitride, silicon oxycarbide, silicon carbonitride, aluminum, magnesium, zinc, hafnium, zirconium, titanium, tantalum, aluminum oxide, titanium oxide, tantalum oxide, magnesium oxide, zinc oxide, hafnium oxide, zirconium oxide, titanium oxide, etc. These may be used alone or in various combinations thereof. According to other exemplary embodiments, the intermediate layer 270 that covers the TFT may not be provided, depending on the material, dimensions, etc. of the planarization layer 290 to be formed later.

The planarization layer 290 may be formed on the intermediate layer 270. The planarization layer 290 may be formed on the element region A of the first substrate 110. A surface of the planarization layer 290 may be flat. That is, the planarization layer 290 may be formed thick enough to planarize its surface on which a pixel will be formed. The planarization layer 290 may be formed of an insulating material. In some embodiments, the planarization layer 290 may be formed of an organic material such as polyimide. Further, the planarization layer 290 may have a single layer structure or a multilayer structure including two or more insulating layers.

The planarization layer 290 may include the via hole 310 that partially exposes the drain electrode 250. In an exemplary embodiment, the via hole 310 may expose a central portion of the drain electrode 250. The via hole 310 may extend in the direction perpendicular to the surface of the first substrate 110.

The first electrode 330 may be positioned on the planarization layer 290. The first electrode 330 may be formed on the element region A of the first substrate 110. The first electrode 330 may be inserted into the via hole 310 and be electrically connected to the drain electrode 250. The first electrode 330 may be an anode or a cathode. If the first electrode 330 is an anode, the second electrode 390 may be a cathode. Thus, embodiments of the present disclosure will be described below based on this assumption. However, the first electrode 330 may also be a cathode, and the second electrode 390 may also be an anode.

When used as an anode, the first electrode 330 may be formed of a conductive material with a high work function. If the OLED is of a bottom emission type, the first electrode 330 may be formed of a material such as ITO, IZO, ZnO or $In_2O_3$ or may be formed of a stacked layer of these materials. If the OLED is of a top emission type, the first electrode 330 may further include a reflective layer formed of Ag, Mg, Al, Pt, Pd, Au, Ni, Nd, Ir, Cr, Li or Ca. The first electrode 330 can be modified in various ways to have, for example, a structure composed of two or more layers formed using two or more different materials selected from the above materials.

The pixel defining layer 350 may be formed on the first electrode 330. The pixel defining layer 350 may be formed on the element region A of the first substrate 110. The pixel defining layer 350 may partially expose the first electrode 330. The pixel defining layer 350 may be formed of at least one organic material selected from benzocyclobutene (BCB), polyimide (PI), polyamaide (PA), acrylic resin and phenolic resin or an inorganic material such as silicon nitride. The pixel defining layer 350 may also be formed of a photosensitizer that contains a black pigment. In this case, the pixel defining layer 350 may serve as a light blocking member.

The organic light-emitting layer 370 is formed on the first electrode 330. The organic light-emitting layer 370 may be formed on the element region A of the first substrate 110. In response to an electric current supplied to the organic light-emitting layer 370, electrons and holes within the organic light-emitting layer 370 may recombine to form excitons, and energy from the excitons may generate light of a certain wavelength. The organic light-emitting layer 370 may be formed of a small molecular weight organic material or a polymer organic material. The organic light-emitting layer 370 may include a hole-injection layer (HIL), a hole-transporting layer (HTL), a hole blocking layer (HBL), an emitting layer (EML), an electron-transporting layer (ETL), an electron-injection layer (EIL), and an electron blocking layer (EBL).

The second electrode 390 may be formed on the organic light-emitting layer 370. The second electrode 390 may be formed on the element region A of the first substrate 110. When used as a cathode, the second electrode 390 may be formed of a conductive material with a low work function. In an exemplary embodiment, the second electrode 390 may be formed of Ag, Mg, Al, Pt, Pd, Au, Ni, Nd, Ir, Cr, Li or Ca. The formation of the second electrode 390 on the organic light-emitting layer 370 may produce an organic light-emitting element, which includes the first electrode 330, the organic light-emitting layer 370 and the second electrode 390, on the first substrate 110 as a display element of the OLED.

The passivation layer 410 may be formed on the second electrode 390. The passivation layer 410 may be formed on the element region A of the first substrate 110. The passivation layer 410 may protect the organic light-emitting element from external moisture or oxygen, thereby preventing degradation of the organic light-emitting element. The passivation layer 410 may be an organic layer, an inorganic layer, or a multi-layer composed of the organic layer and the inorganic layer. The inorganic layer may be an insulating layer such as a silicon oxide ($SiO_2$) layer, a silicon nitride (SiNx) layer, or a silicon oxynitride ($SiO_xN_y$) layer. Also, the inorganic layer may be a LiF layer. The organic layer may be a layer containing NPB(N,N'-Bis(naphthalen-1-yl)-N,N'-bis(phenyl)benzidine), TNATA, TCTA, TDAPB, TDATA, $Alq_3$, Balq or CBP. The passivation layer 410 may be formed by evaporation, chemical vapor deposition (CVD), or sputtering.

The second substrate 430 may be positioned on the passivation layer 410. The second substrate 430 may be separated from the passivation layer 410 by a predetermined distance. A space between the second substrate 430 and the passivation layer 410 may be filled with nitrogen, etc. The second substrate 430 may face the first substrate 110. The second substrate 430 may be positioned to cover both the element region A and the encapsulation region B of the first substrate 110. The second substrate 430 may encapsulate the organic light-emitting element and the TFT, together with the encapsulant 490. The second substrate 430 may be transparent insulating glass or plastic, but is not limited thereto, and may be formed of various materials that can block external substances. In an exemplary embodiment, the second substrate 430 may be formed of the same material as the first substrate 110.

The encapsulant 490 may be formed on the edge portion of the first substrate 110 and the second substrate 430. In an exemplary embodiment, the encapsulant 490 may be formed on the encapsulation region B of the first substrate 110. In some embodiments, the encapsulant 490 may not exist on the element region A of the first substrate 110. The encapsulant 490 may contact the interlayer insulating film 190 disposed on the first substrate 110. However, the present disclosure is not limited thereto, and the encapsulant 490 may also contact the gate insulating layer 150 or the first substrate 110. In the exemplary embodiment of FIG. 1, the encapsulant 490 may encapsulate the organic light-emitting element and the TFT by contacting the interlayer insulating film 190 and the second substrate 430.

The encapsulant 490 may include a first encapsulant 490a and a second encapsulant 490b. The first encapsulant 490a may be disposed on the entire encapsulation region B of the first substrate 110. That is, the first encapsulant 490a may form the overall frame for encapsulating the organic light-emitting element, the TFT, etc. The first encapsulant 490a may be a main encapsulant for encapsulating the organic light-emitting element, the TFT, etc. The first encapsulant 490a may be a connector that connects at least one of the interlayer insulating film 190, the gate insulating layer 150 and the first substrate 110 to the second substrate 430. The first encapsulant 490a may include glass frit. The glass frit may be formed of one material selected from the group including, for example, lead oxide (PbO), diboron trioxide ($B_2O_8$), and $SiO_2$. The glass frit may be formed by screen printing or dispensing. In the present disclosure, however, the material and method used to form the glass frit are not limited to those set forth herein.

The second encapsulant 490b may be located within the first encapsulant 490a. The second encapsulant 490 may be formed on a portion of the element region A of the first substrate 110. The second encapsulant 490b may be a sub-encapsulant for improving mechanical strength of the encapsulant 490. The second encapsulant 490b may be formed adjacent to at least one of the first substrate 110 and the second substrate 430. In the exemplary embodiment of FIG. 1, the second encapsulant 490b is formed in a region adjacent to the first substrate 110, but is not limited thereto, and may also be formed in a region adjacent to the second substrate 430. The second encapsulant 490b may also be formed in both the region adjacent to the first substrate 110 and the region adjacent to the second substrate 430.

The second encapsulant 490b may include a metallic material. In an exemplary embodiment, the metallic material may include at least one of aluminum and silver, but is not limited thereto, and may also include iron (Fe), copper (Cu), and zinc (Zn). A melting point of the metallic material may be less than about 1000° C. or below. In some embodiments, the melting point of the metallic material may be in a range of 0 to 1000° C. In some embodiments the melting point of the metallic material may be less than, equal to or between 0, 50, 100, 150, 200, 250, 300, 350, 400, 450, 500, 550, 600, 650, 700, 750, 800, 850, 900, 950, 100° C. or any temperature in between. The metallic material heated to about 1000° C. or above may change from a solid state to a liquid state.

The second encapsulant 490b may be formed in a shape spread randomly in a direction away from the first substrate 110 or the second substrate 430. That is, the second encapsulant 490b may be formed in a shape randomly spread in a direction away from a start point. The second encapsulant 490b may spread in a similar manner to the manner in which a drop of colored ink dropped into clear water randomly spreads into the clear water. In the exemplary embodiment of FIG. 1, the spread start point of the second encapsulant 490b may be a portion adjacent to the first substrate 110, for example, a top surface of the interlayer insulating film 190. Thus, the second encapsulant 490b may randomly spread from the top surface of the interlayer insulating film 190 in a direction toward the second substrate 430. Here, the spread start point of the second encapsulant 490b may contact the interlayer insulating film 190 but may not contact a structure (for example, the second substrate 430) located in the direction in which the second encapsulant 490b spreads. However, the present disclosure is not limited thereto, and the second encapsulant 490b may also contact both the spread start point and the structure located in the spread direction of the second encapsulant 490b.

A volume ratio of the second encapsulant 490b to the first encapsulant 490a may increase toward the first substrate 110 or the second substrate 430. Since the second encapsulant 490b spreads randomly in the direction away from the first substrate 110 or the second substrate 430 as described above, an amount of the second encapsulant 490b relative to an amount of the first encapsulant 490a may increase toward the first substrate 110 or the second substrate 430. That is, as the distance to the first substrate 110 or the second substrate 430 decreases, the proportion of the second encapsulant 490b in the encapsulant 490b may increase.

An interface between the second encapsulant 490b and the first encapsulant 490a may be formed of metal oxide. That is, oxygen in the first encapsulant 490a and a metallic material in the second encapsulant 490b may react with each other to form metal oxide. Here, a thickness of the metal oxide may be set to a desired thickness by adjusting a period of time during which the above reaction environment is maintained.

The second encapsulant 490b may be formed of the same material as at least one of the gate electrode 170, the source electrode 230, and the drain electrode 250. In an exemplary embodiment, the second encapsulant 490b may be formed of the same material as the source electrode 230 and the drain electrode 250. However, the present disclosure is not limited thereto, and the second encapsulant 490b may also be formed of the same material as the gate electrode 170.

Figure 5:
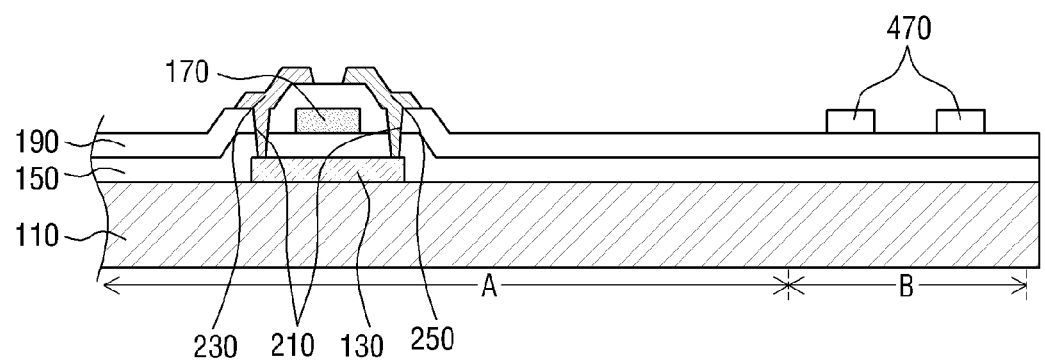
FIG. 5 is a cross-sectional view illustrating forming a source electrode, a drain electrode, and metal patterns during manufacturing the OLED of FIG. 1.

The second encapsulant 490b may result from melting of metal patterns 470 (see FIG. 5). These metal patterns 470 may be formed simultaneously with at least one of the gate electrode 170, the source electrode 230, and the drain electrode 250. In an exemplary embodiment, the metal patterns 470 may be formed at the same time as the source electrode 230 and the drain electrode 250. However, the present disclosure is not limited thereto, and the metal patterns 470 may also be formed at the same time as the gate electrode 170.

Display properties of the OLED change sensitively to penetration of oxygen and moisture. Thus, encapsulation technology that can prevent penetration of oxygen and moisture is required. One example of a suitable material applicable to such encapsulation technology is glass frit. If edges of the first and second substrates 110 and 430 are sealed with the glass frit, it is possible to effectively prevent oxygen and moisture from penetrating into the organic light-emitting element and the TFT.

However, the glass frit has comparatively low mechanical strength. That is, the glass frit is very vulnerable to external impact and vibrations. In some embodiments, if the space between the first substrate 110 and the second substrate 430 is filled with nitrogen, since there is no layer for absorbing external impact and vibrations, the external impact and vibrations may be transmitted, as they are, to the glass frit, thus easily damaging the glass frit. When the glass frit that encapsulates the organic light-emitting element is damaged, oxygen and moisture may penetrate into the organic light-emitting element, thereby degrading display quality of the OLED. For example, a dark spot may be formed in a pixel adjacent to the damaged glass frit, and a developing dark spot defect in which the dark spot gradually spreads may occur.

In the OLED according to the current embodiment, however, the second encapsulant 490b including a metallic material is located within the first encapsulant 490a including glass frit. This improves the overall mechanical strength of the encapsulant 490. Specifically, since the first encapsulant 490a disposed between the first substrate 110 and the second substrate 430 adheres to the second encapsulant 490b, the adhesion area of the first encapsulant 490a may increase, thereby improving the overall mechanical strength of the encapsulant 490. For example, since the second encapsulant 490b spreads randomly in the direction away from the first substrate 110 or the second substrate 430, the adhesion area of the first encapsulant 490a and the second encapsulant 490b is comparatively large. Accordingly, the mechanical strength of the encapsulant 490 may increase significantly. In some embodiments, since the encapsulant 490 includes not only glass frit that can effectively prevent penetration of oxygen and moisture but also a metallic material with excellent ductility and elasticity, it is possible to ensure consistent display quality and impact resistance of the OLED including the encapsulant 490.

The metallic material that forms the second encapsulant 490b may be the same as the material that forms at least one of the gate electrode 170, the source electrode 230 and the drain electrode 250 of the TFT. In some embodiments, the metal patterns 470 used to form the second encapsulant 490b may be formed simultaneously with at least one of the gate electrode 170, the source electrode 230, and the drain electrode 250 of the TFT. Therefore, a process of manufacturing the OLED including the second encapsulant 490b may be very effective.

Figure 2:
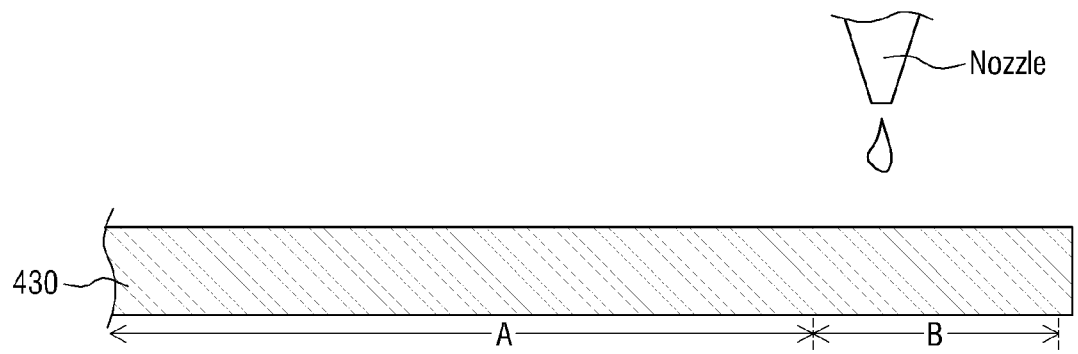
FIG. 2 is a cross-sectional view illustrating ejecting glass frit onto a second substrate during manufacturing the OLED of FIG. 1.
Figure 3:
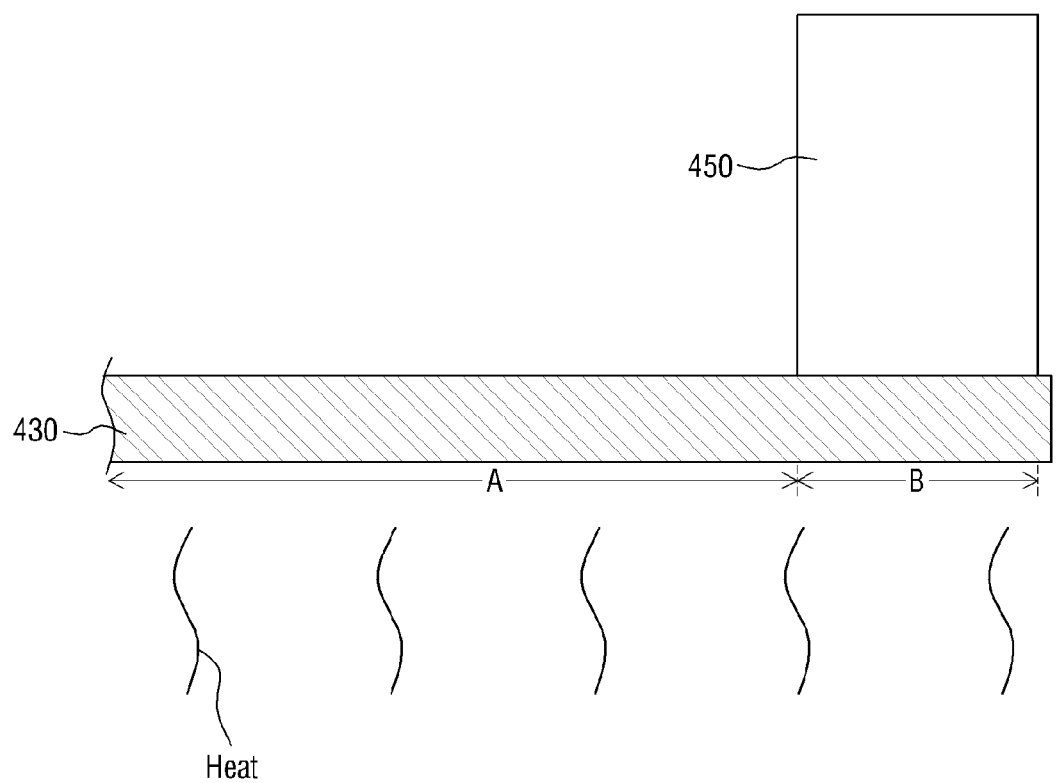
FIG. 3 is a cross-sectional view illustrating forming a glass frit pattern by curing the ejected glass frit during manufacturing the OLED of FIG. 1.
Figure 4:
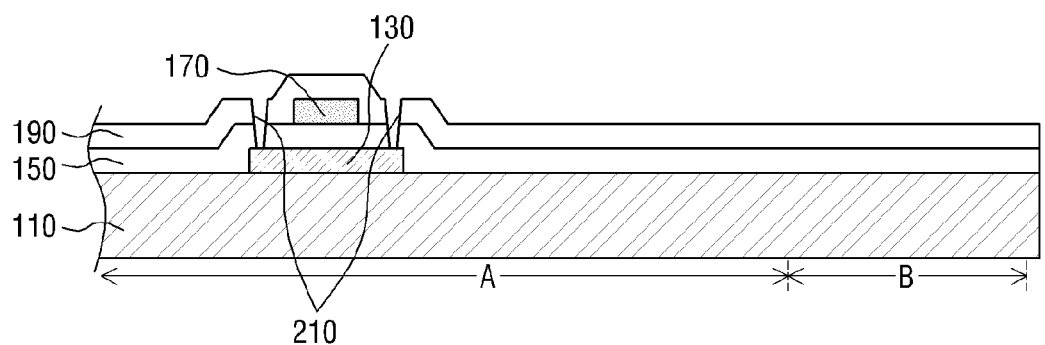
FIG. 4 is a cross-sectional view illustrating forming a semiconductor pattern, a gate insulating layer, a gate electrode, an interlayer insulating film, and contact holes on a first substrate during manufacturing the OLED of FIG. 1.
Figure 6:
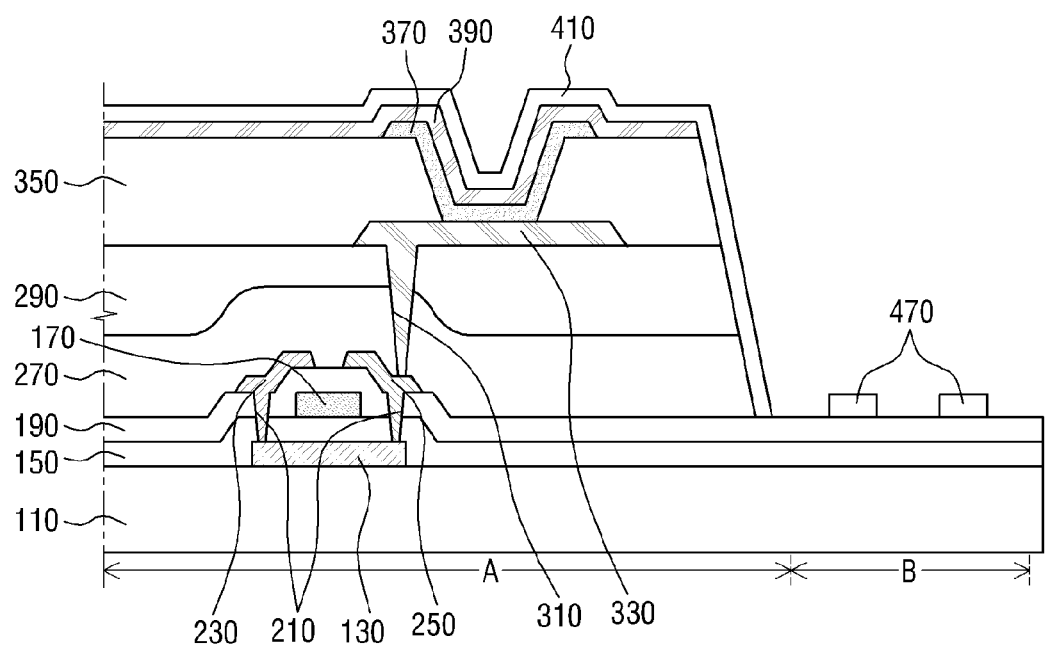
FIG. 6 is a cross-sectional view illustrating forming an intermediate layer, a planarization layer, a via hole, a first electrode, a pixel defining layer, an organic light-emitting layer, a second electrode, and a passivation layer during manufacturing the OLED of FIG. 1.
Figure 7:
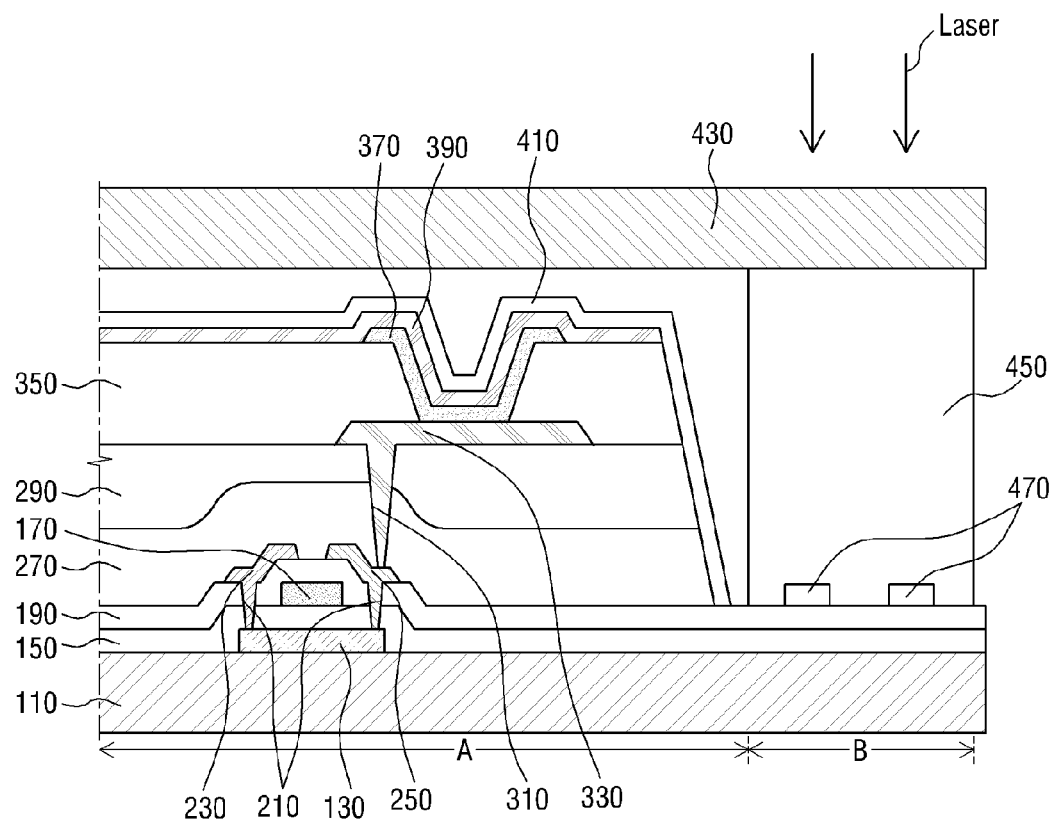
FIG. 7 is a cross-sectional view illustrating encapsulating an organic light-emitting element during manufacturing the OLED of FIG. 1.

A method of manufacturing an OLED according to an embodiment of the present disclosure will now be described with reference to FIGS. 2 through 7. FIG. 2 is a cross-sectional view illustrating an operation of ejecting glass frit onto a second substrate 430 during a process of manufacturing the OLED of FIG. 1. FIG. 3 is a cross-sectional view illustrating an operation of forming a glass frit pattern 450 by curing the ejected glass frit during the process of manufacturing the OLED of FIG. 1. FIG. 4 is a cross-sectional view illustrating an operation of forming a semiconductor pattern 130, a gate insulating layer 150, a gate electrode 170, an interlayer insulating film 190, and contact holes 210 on a first substrate 110 in the process of manufacturing the OLED of FIG. 1. FIG. 5 is a cross-sectional view illustrating forming a source electrode 230, a drain electrode 250, and metal patterns 470 during the process of manufacturing the OLED of FIG. 1. FIG. 6 is a cross-sectional view illustrating an operation of forming an intermediate layer 270, a planarization layer 290, a via hole 310, a first electrode 330, a pixel defining layer 350, an organic light-emitting layer 370, a second electrode 390, and a passivation layer 410 during the process of manufacturing the OLED of FIG. 1. FIG. 7 is a cross-sectional view illustrating an operation of encapsulating an organic light-emitting element during manufacturing the OLED of FIG. 1. For simplicity, elements substantially identical to those of FIG. 1 are indicated by like reference numerals, and thus, a redundant description thereof will be omitted.

Referring to FIG. 2, glass frit may be ejected onto the second substrate 430 using a nozzle. Here, the glass frit may be glass frit that forms a first encapsulant 490a. The glass frit may be ejected onto an edge portion of the second substrate 430. Here, the edge portion of the second substrate 430 may be a region corresponding to an encapsulation region B of the first substrate 110.

Referring to FIG. 3, after the ejection of the glass frit, the glass frit pattern 450 may be formed by curing the ejected glass frit with heat. Curing the glass frit with heat may be referred to as a first curing process. In an exemplary embodiment, the first curing process may be a process of inserting the second substrate 430 and the glass frit ejected onto the second substrate 430 into an oven and curing the whole of the second substrate 430 and the glass frit ejected onto the second substrate 430. A shape of the glass frit pattern 450 formed by this process may be substantially the same as a shape of the encapsulant 490 to be formed later.

Referring to FIG. 4, after the formation of the glass frit pattern 450 on the second substrate 430, the semiconductor pattern 130, the gate insulating layer 150, the gate electrode 170, the interlayer insulating film 190, and the contact holes 210 may be sequentially formed on the first substrate 110. The semiconductor pattern 130, the gate insulating layer 150, the gate electrode 170, and the interlayer insulating film 190 may be formed by, but not limited to, a typical deposition process, and the contact holes 210 may be formed by, but not limited to, a typical etching process.

Referring to FIG. 5, after the formation of the semiconductor pattern 130, the gate insulating layer 150, the gate electrode 170, the interlayer insulating film 190 and the contact holes 210 on the first substrate 110, the source electrode 230, the drain electrode 250, and the metal patterns 470 may be formed simultaneously. Here, the source electrode 230 and the drain electrode 250 may be inserted into the contact holes 210 on an element region A, and the metal patterns 470 may be formed on the interlayer insulating film 190 on the encapsulation region B. In an exemplary embodiment, the source electrode 230, the drain electrode 250, and the metal patterns 470 may all be formed of the same material such as aluminum or silver.

Referring to FIG. 6, after the formation of the source electrode 230, the drain electrode 250 and the metal patterns 470, the intermediate layer 270, the planarization layer 290, the via hole 310, the first electrode 330, the pixel defining layer 350, the organic light-emitting layer 370, the second electrode 390, and the passivation layer 410 may be formed sequentially. The intermediate layer 270, the passivation layer 290, the via hole 310, the first electrode 330, the pixel defining layer 350, the organic light-emitting layer 370, the second electrode 390, and the passivation layer 410 may all be formed on the element region A. Each of the intermediate layer 270, the planarization layer 290, the via hole 310, the first electrode 330, the pixel defining layer 350, the organic light-emitting layer 370, the second electrode 390, and the passivation layer 410 may be formed by a typical deposition or etching process.

The order of the process of FIGS. 2 and 3, that is, the process of forming the glass frit pattern 450 on the second substrate 430 and the process of FIGS. 4 through 6, that is, the process of forming a plurality of structures on the first substrate 110 can be reversed.

Referring to FIG. 7, after the formation of the intermediate layer 270, the planarization layer 290, the via hole 310, the first electrode 330, the pixel defining layer 350, the organic light-emitting layer 370, the second electrode 390, and the passivation layer 410 on the first substrate 110, the organic light-emitting element may be encapsulated by bonding the metal patterns 470 disposed on the first substrate 110 and the glass frit pattern 450 disposed on the second substrate 430. Specifically, the second substrate 430 is placed over the first substrate 110 such that the metal patterns 470 face the glass frit pattern 450. Then, a gap between the first substrate 110 and the second substrate 430 is reduced to bring the metal patterns 470 and the glass frit pattern 450 into contact with each other. Here, since the glass frit pattern 450 has elasticity and ductility, it may be deformed to surround the metal patterns 470. That is, the glass frit pattern 450 may contact top and side surfaces of the metal patterns 470.

To encapsulate the organic light-emitting element more perfectly, laser beams may be irradiated to the metal patterns 470 after the bonding of the metal patterns 470 and the glass frit pattern 450. In an exemplary embodiment, laser beams may irradiate the second substrate 430 from above in a direction toward the metal patterns 470, so that the metal patterns 470 can spread into the glass frit pattern 450. This laser irradiation may be referred to as a second curing process. The second curing process may be a process of laser beam irradiation only to the glass frit pattern 450 and the metal patterns 470. Specifically, laser beams that pass through the transparent second substrate 430 may heat the glass frit pattern 450, and heat of the heated glass frit pattern 450 may be transmitted to the metal patterns 470. Accordingly, the metal patterns 470 may be heated to a temperature of greater than or equal to about 1000° C. In an exemplary embodiment, the temperature of the heated metal patterns 470 may range from 1000 to 1300° C. or be equal to about 1000, 1050, 1100, 1150, 1200, 1250, 1300° C. or any temperature therebetween. The heated metal patterns 470 may melt and spread randomly into the glass frit pattern 450, thereby forming a second encapsulant 490b. Here, the glass frit pattern 450 surrounding the second encapsulant 490b may become the first encapsulant 490a. That is, the process of FIG. 7 may produce the OLED according to the embodiment of FIG. 1.

As described above, the method of manufacturing the OLED according to the current embodiment is a very efficient process and can be used to manufacture an OLED with consistent display quality and impact resistance.

Figure 8:
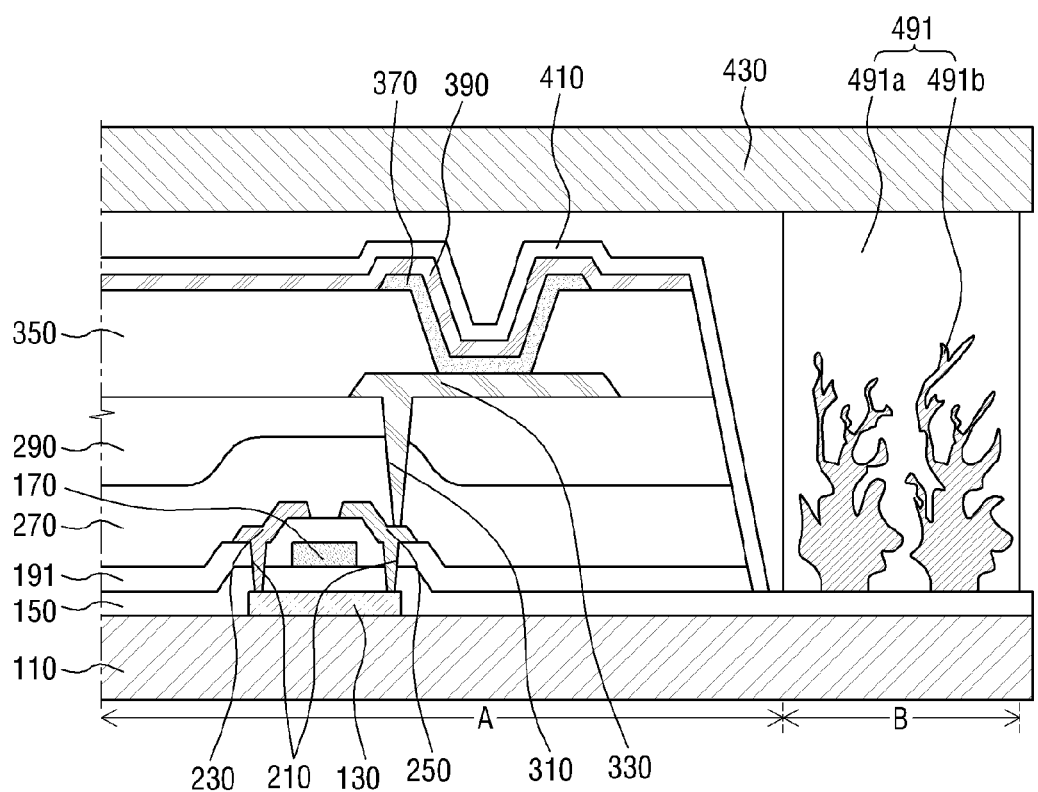
FIG. 8 is a cross-sectional view of an OLED according to another embodiment of the present disclosure.

An OLED according to another embodiment of the present disclosure will now be described with reference to FIG. 8. FIG. 8 is a cross-sectional view of an OLED according to another embodiment of the present disclosure. For simplicity, elements substantially identical to those of FIG. 1 are indicated by like reference numerals, and thus, a redundant description thereof will be omitted. Referring to FIG. 8, in the OLED according to the current embodiment, an encapsulant 491 may encapsulate an organic light-emitting element, a TFT, etc. by directly contacting a gate insulating layer 150 and a second substrate 430. That is, the gate insulating layer 150 may be formed on an element region A and an encapsulation region B. However, an interlayer insulating film 191 may be formed only on the element region A, and the encapsulant 491 may be formed directly on the gate insulating layer 150 disposed on the encapsulation region B.

A thickness of a first encapsulant 491a may be increased by a thickness of the interlayer insulating film 191. In some embodiments, a second encapsulant 491b may be formed of the same material as a gate electrode 170. Metal patterns (not shown) used to form the second encapsulant 491b may be formed on the gate insulating layer 150 simultaneously with the gate electrode 170.

Figure 9:
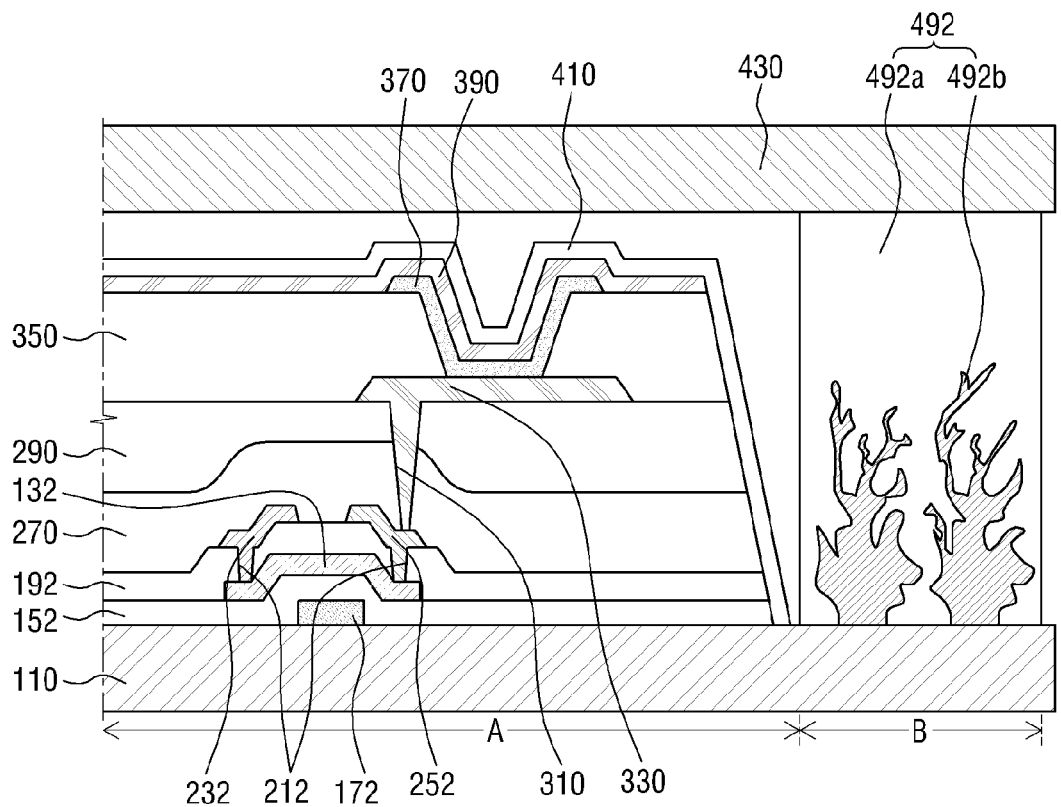
FIG. 9 is a cross-sectional view of an OLED according to another embodiment of the present disclosure.

An OLED according to another embodiment of the present disclosure will now be described with reference to FIG. 9. FIG. 9 is a cross-sectional view of an OLED according to another embodiment of the present disclosure. For simplicity, elements substantially identical to those of FIG. 1 are indicated by like reference numerals, and thus, a redundant description thereof will be omitted. Referring to FIG. 9, in the OLED according to the current embodiment, a TFT may be a bottom gate TFT. That is, a gate electrode 172 may be formed on a first substrate 110, and a gate insulating layer 152 may be formed on the gate electrode 172. In some embodiments, a semiconductor pattern 132 may be formed on the gate insulating layer 152 to overlap the gate electrode 172, and an interlayer insulating film 192 may be formed on the semiconductor pattern 132. Further, contact holes 212 partially exposing the semiconductor pattern 132 may be formed in the interlayer insulating film 192, and a source electrode 232 and a drain electrode 252 may be inserted into the contact holes 212, respectively. The gate electrode 172, the gate insulating layer 152, the semiconductor pattern 132, the interlayer insulating film 192, the contact holes 212, the source electrode 232, and the drain electrode 252 may all be formed on an element region A of the first substrate 110.

Here, an encapsulant 492 may encapsulate an organic light-emitting element, the TFT, etc. by directly contacting the first substrate 110 and a second substrate 430. That is, since the gate insulating layer 152 and the interlayer insulating film 192 are formed only on the element region A as described above, the encapsulant 492 may be formed directly on an encapsulation region B of the first substrate 110.

A thickness of a first encapsulant 492a may be increased by a thickness of the gate insulating layer 152 and a thickness of the interlayer insulating film 192. In some embodiments, a second encapsulant 492b may be formed of the same material as a gate electrode 172. Metal patterns (not shown) used to form the second encapsulant 492b may be formed on the first substrate 110 simultaneously with the gate electrode 172.

Figure 10:
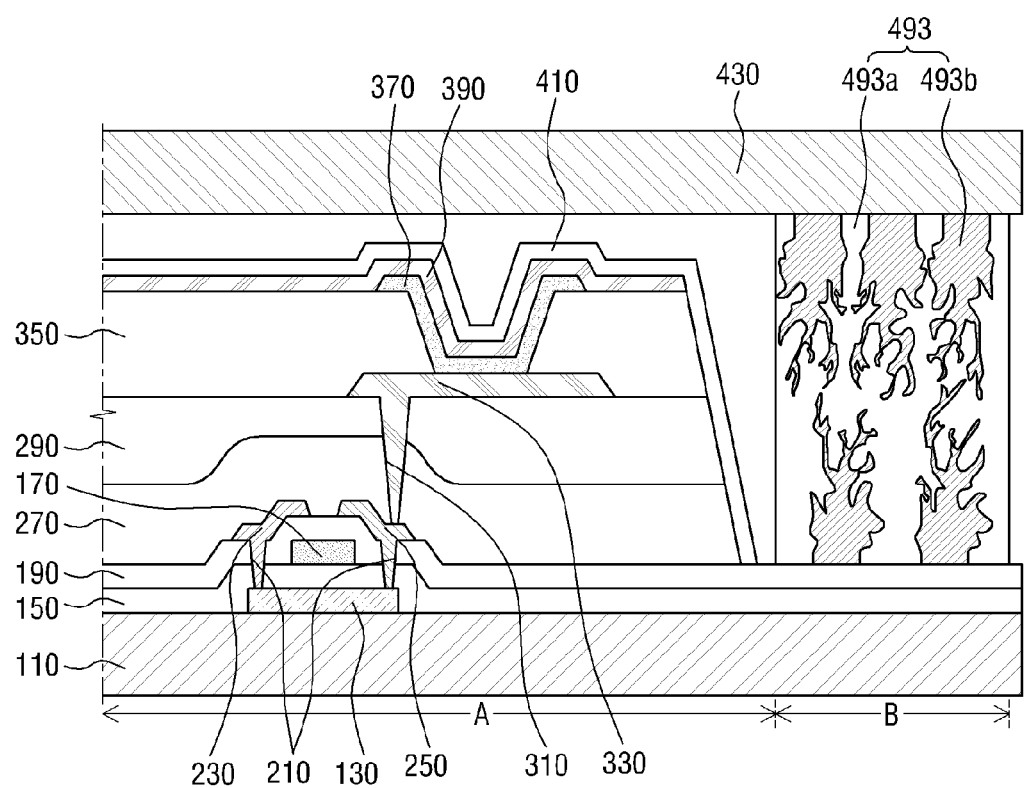
FIG. 10 is a cross-sectional view of an OLED according to another embodiment of the present disclosure.

An OLED according to another embodiment of the present disclosure will now be described with reference to FIG. 10. FIG. 10 is a cross-sectional view of an OLED according to another embodiment of the present disclosure. For simplicity, elements substantially identical to those of FIG. 1 are indicated by like reference numerals, and thus, a redundant description thereof will be omitted.

Referring to FIG. 10, the OLED according to the current embodiment may include a second encapsulant 493b in more amounts than the OLED according to the embodiment of FIG.

1. In an exemplary embodiment, an encapsulant 493 may include a first encapsulant 493a and the second encapsulant 493b located within the first encapsulant 493a as described above. The second encapsulant 493b may be formed in both a region adjacent to a first substrate 110 and a region adjacent to a second substrate 430. Specifically, the second encapsulant 493b may directly contact an interlayer insulating film 190 on the first substrate 110 and the second substrate 430 and may spread randomly in a direction toward a center of the encapsulant 493. In some embodiments, a ratio of volume of the second encapsulant 493b to volume of the first encapsulant 493a may increase from the lower end toward upper end or from the upper end to the lower end of the encapsulant 493. That is, the volume ratio of the second encapsulant 493b to the first encapsulant 493a may decrease toward the center of the encapsulant 493. Although not shown in FIG. 10, the second encapsulant 493b formed in an upper part of the encapsulant 493 may be connected to the second encapsulant 493b formed in a lower part of the encapsulant 493.

Since the OLED according to the current embodiment includes the second encapsulant 493b at both ends of the encapsulant 493, mechanical strength of the encapsulant 493 can be improved further.

Figure 11:
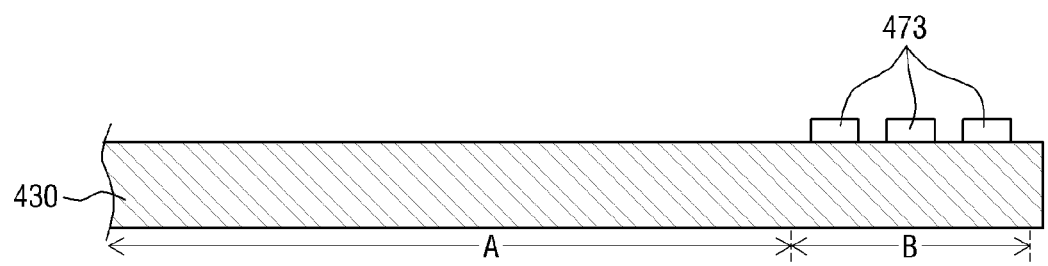
FIG. 11 is a cross-sectional view illustrating forming metal patterns on a second substrate during manufacturing the OLED of FIG. 10.
Figure 12:
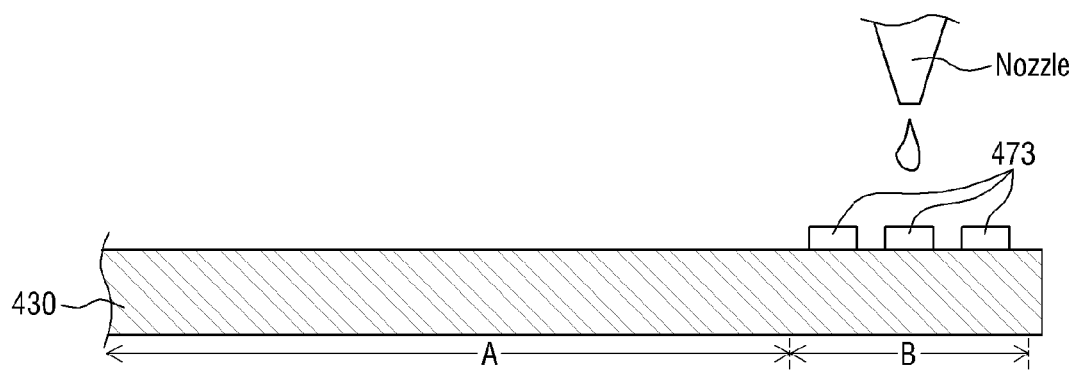
FIG. 12 is a cross-sectional view illustrating ejecting glass frit onto the metal patterns during manufacturing the OLED of FIG. 10.
Figure 13:
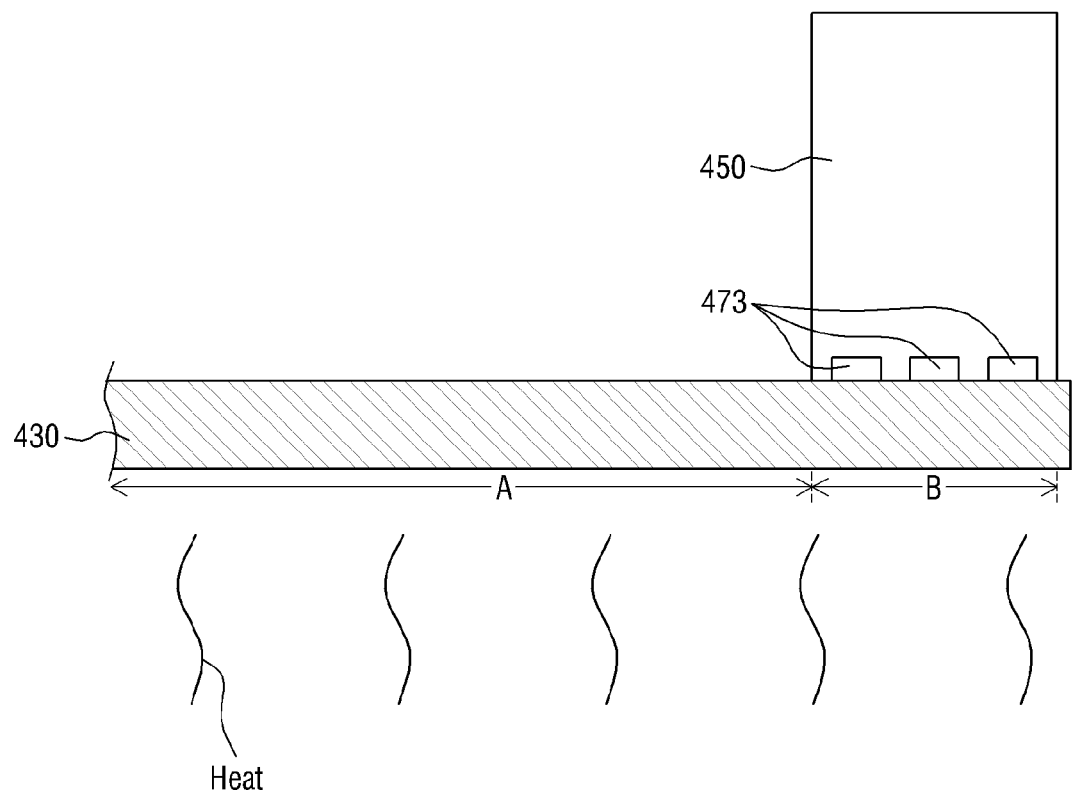
FIG. 13 is a cross-sectional view illustrating an operation of forming a glass frit pattern by curing the ejected glass frit during manufacturing the OLED of FIG. 10.
Figure 14:
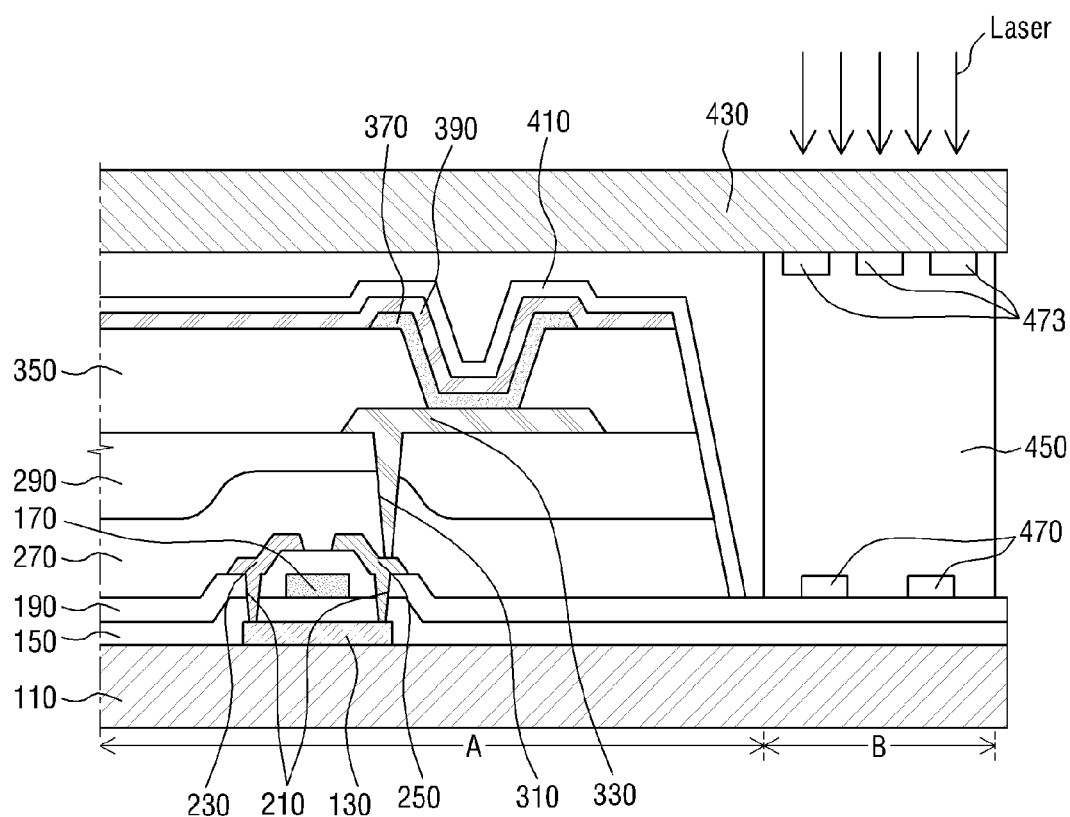
FIG. 14 is a cross-sectional view illustrating encapsulating an organic light-emitting element during manufacturing the OLED of FIG. 10.

A method of manufacturing an OLED according to another embodiment of the present disclosure will now be described with reference to FIGS. 11 through 14. FIG. 11 is a cross-sectional view illustrating an operation of forming metal patterns 473 on a second substrate 430 during a process of manufacturing the OLED of FIG. 10. FIG. 12 is a cross-sectional view illustrating an operation of ejecting glass frit onto the metal patterns 473 during the process of manufacturing the OLED of FIG. 10. FIG. 13 is a cross-sectional view illustrating an operation of forming a glass frit pattern 450 by curing the ejected glass frit during the process of manufacturing the OLED of FIG. 10. FIG. 14 is a cross-sectional view illustrating an operation of encapsulating an organic light-emitting element during the process of manufacturing the OLED of FIG. 10. For simplicity, elements substantially identical to those of FIGS. 1 through 7 are indicated by like reference numerals, and thus a redundant description thereof will be omitted.

Referring to FIG. 11, the metal patterns 473 may be formed on the second substrate 430. Here, the metal pattern 473 may be substantially the same as the metal patterns 470 described above. The metal patterns 473 may be formed on an edge portion of the second substrate 430. Here, the edge portion of the second substrate 430 may be a region corresponding to an encapsulation region B of a first substrate 110.

Referring to FIG. 12, after the formation of the metal patterns 473, glass frit may be ejected onto the metal patterns 473 using a nozzle. Here, the glass frit may be glass frit that forms a first encapsulant 493a.

Referring to FIG. 13, after the ejection of the glass frit, the glass frit pattern 450 may be formed by curing the ejected glass frit with heat.

Referring to FIG. 14, after the formation of the glass frit pattern 450, the organic light-emitting element may be encapsulated by bonding the metal patterns 470 disposed on the first substrate 110 of FIG. 6 and the glass frit pattern 450 disposed on the second substrate 430. Here, the metal pattern 470 disposed on the first substrate 110 and the metal patterns 473 disposed on the second substrate 430 may be arranged alternately. In other words, the metal patterns 470 disposed on the first substrate 110 and the metal patterns 473 disposed on the second substrate 430 may be arranged in a zigzag pattern.

To encapsulate the organic light-emitting element more perfectly, laser beams may be irradiated to the metal patterns 470 disposed on the first substrate 110 and the metal patterns 473 disposed on the second substrate 430. In an exemplary embodiment, laser beams may be irradiated from above the second substrate 430 in a direction toward an encapsulant 493, so that the metal patterns 470 on the first substrate 110 and the metal patterns 473 on the second substrate 430 can spread into the glass frit pattern 450. The process of FIG. 14 may produce the OLED according to the embodiment of FIG. 10.

Figure 15:
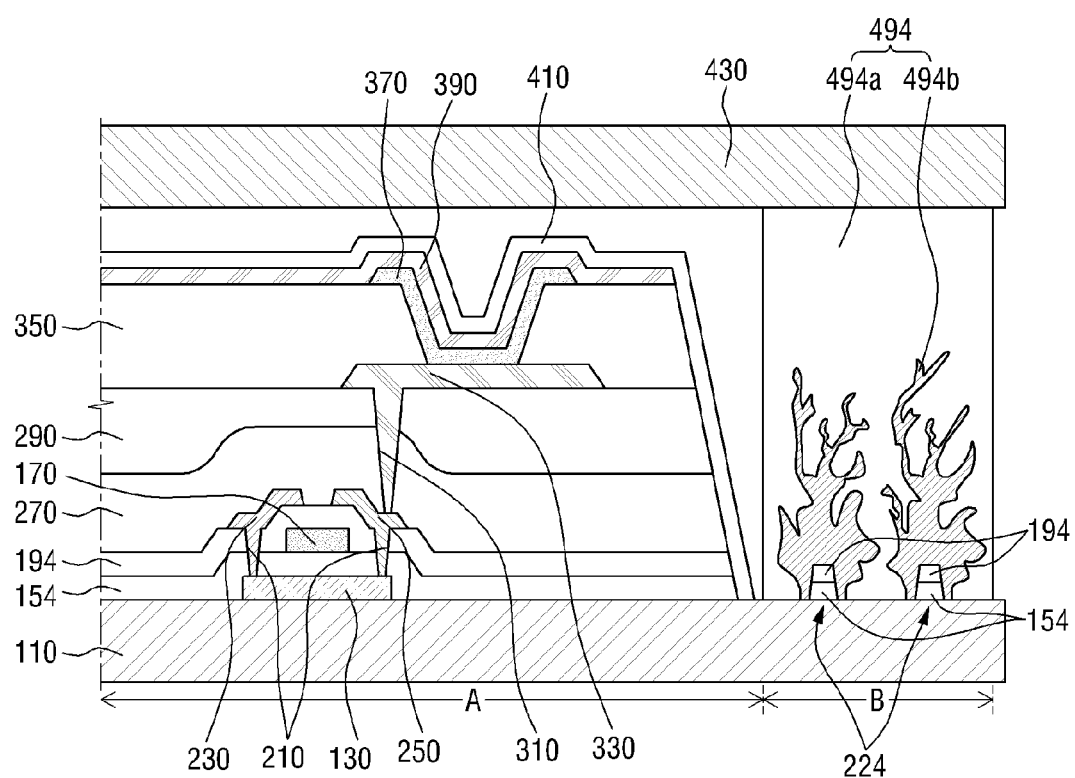
FIG. 15 is a cross-sectional view of an OLED according to another embodiment of the present disclosure.

An OLED according to another embodiment of the present disclosure will now be described with reference to FIG. 15. FIG. 15 is a cross-sectional view of an OLED according to another embodiment of the present disclosure. For simplicity, elements substantially identical to those of FIG. 1 are indicated by like reference numerals, and thus, a redundant description thereof will be omitted.

Referring to FIG. 15, the OLED according to the current embodiment may include insulating layer patterns 224. Specifically, one or more insulating layer patterns 224, each composed of a gate insulating layer 154 and an interlayer insulating film 194, may be disposed on an encapsulation region B of a first substrate 110. Here, the insulating layer patterns 224 may be protruding patterns that protrude upward from the first substrate 110.

An encapsulant 494 may include a first encapsulant 494a and a second encapsulant 494b located within the first encapsulant 494a as described above. A spread start point of the second encapsulant 494b may be surfaces of the insulating layer patterns 224. That is, the second encapsulant 494b may spread randomly in a direction away from top and side surfaces of the insulating layer patterns 224.

In the OLED according to the current embodiment, the spread start point of the second encapsulant 494b is set to the surfaces of the insulating layer patterns 224. This increases the adhesion area of the second encapsulant 494b, which further improves mechanical strength of the encapsulant 494.

Figure 16:
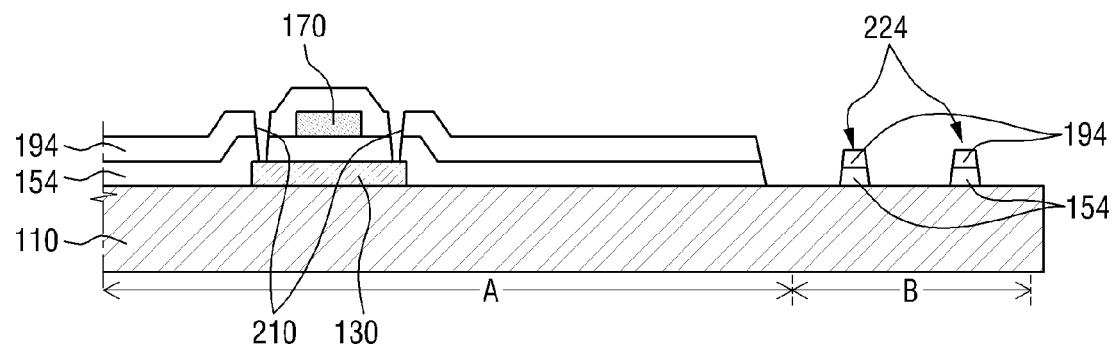
FIG. 16 is a cross-sectional view illustrating forming insulating layer patterns in manufacturing the OLED of FIG. 15.
Figure 17:
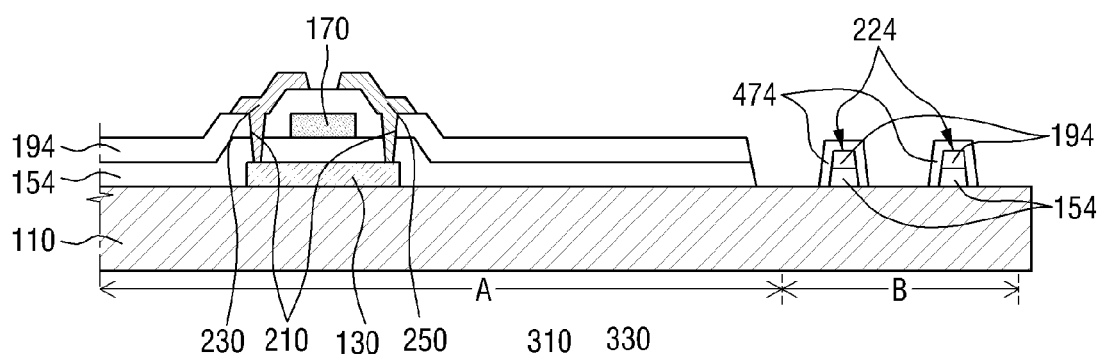
FIG. 17 is a cross-sectional view illustrating forming metal patterns during manufacturing the OLED of FIG. 15.
Figure 18:
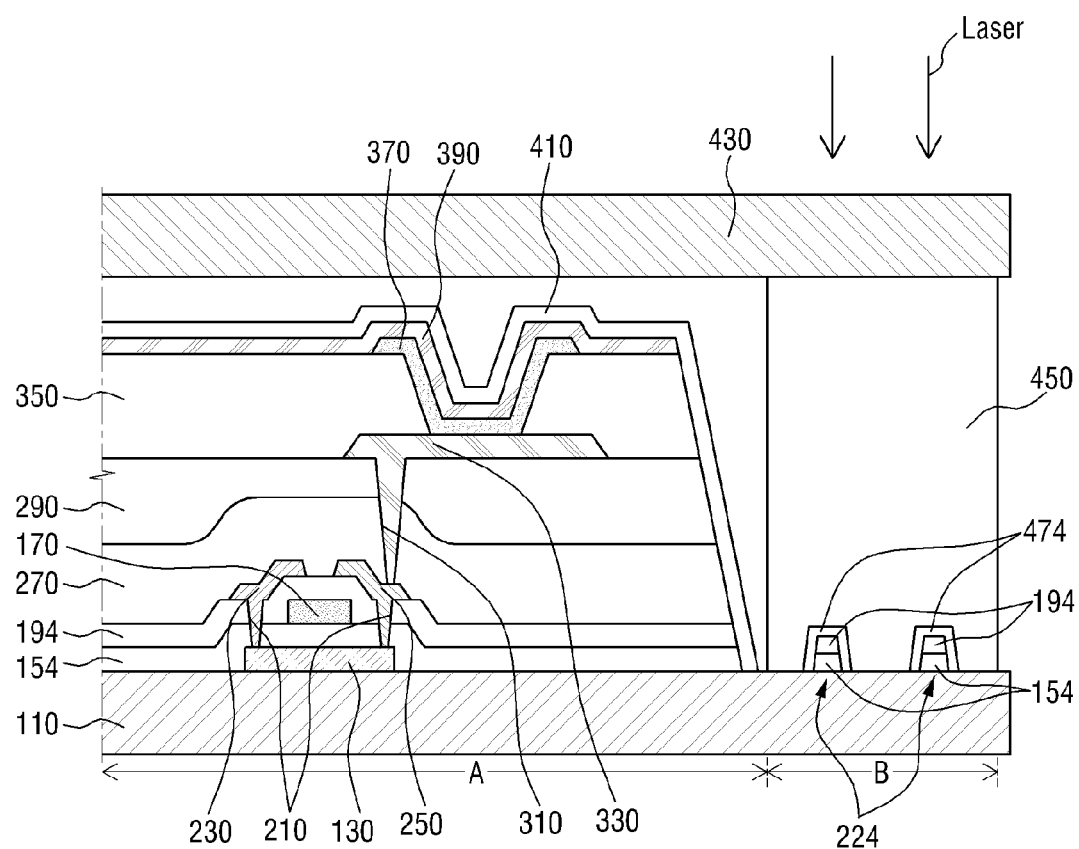
FIG. 18 is a cross-sectional view illustrating encapsulating an organic light-emitting element during manufacturing the OLED of FIG. 15.

A method of manufacturing an OLED according to another embodiment of the present disclosure will now be described with reference to FIGS. 16 through 18. FIG. 16 is a cross-sectional view illustrating an operation of forming insulating layer patterns 224 during a process of manufacturing the OLED of FIG. 15. FIG. 17 is a cross-sectional view illustrating an operation of forming metal patterns 474 during the process of manufacturing the OLED of FIG. 15. FIG. 18 is a cross-sectional view illustrating an operation of encapsulating an organic light-emitting element during the process of manufacturing the OLED of FIG. 15. For simplicity, elements substantially identical to those of FIGS. 1 through 7 are indicated by like reference numerals, and thus, a redundant description thereof will be omitted.

Referring to FIG. 16, a semiconductor pattern 130, a gate insulating layer 154, a gate electrode 170, an interlayer insulating film 194, contact holes 210, and the insulating layer patterns 224 may be formed on a first substrate 110. After the formation of the semiconductor pattern 130, the gate insulating layer 154, the gate electrode 170 and the interlayer insulating film 194, the contact holes 210 and the insulating layer patterns 224 may be formed simultaneously on an element region A and an encapsulation region B, respectively, by using a typical etching process. The insulating layer patterns 224 may protrude upward from the first substrate 110. The contact holes 210 and the insulating layer patterns 224 may be formed using a single mask.

Referring to FIG. 17, after the formation of the semiconductor pattern 130, the gate insulating layer 154, the gate electrode 170, the interlayer insulating film 194, the contact holes 210 and the insulating layer patterns 224 on the first substrate 110, a source electrode 230, a drain electrode 250, and the metal patterns 474 may be formed. Specifically, the source electrode 230 and the drain electrode 250 may be inserted into the contact holes 210, and the metal patterns 474 may be formed to cover both top and side surfaces of the insulating layer patterns 224.

Referring to FIG. 18, after the formation of the source electrode 230, the drain electrode 250 and the metal patterns 474, an intermediate layer 270, a planarization layer 290, a via hole 310, a first electrode 330, a pixel defining layer 350, an organic light-emitting layer 370, a second electrode 390, and a passivation layer 410 may be formed on the source electrode 230 and the drain electrode 250. Then, the organic light-emitting element may be encapsulated by bonding the glass frit pattern 450 of the structure shown in FIG. 3 and the metal patterns 474. To encapsulate the organic light-emitting element more perfectly, the metal patterns 474 may be spread into the glass frit pattern 450 by irradiating laser beams to the metal patterns 474. The process of FIG. 18 may produce the OLED according to the embodiment of FIG. 15.

Figure 19:
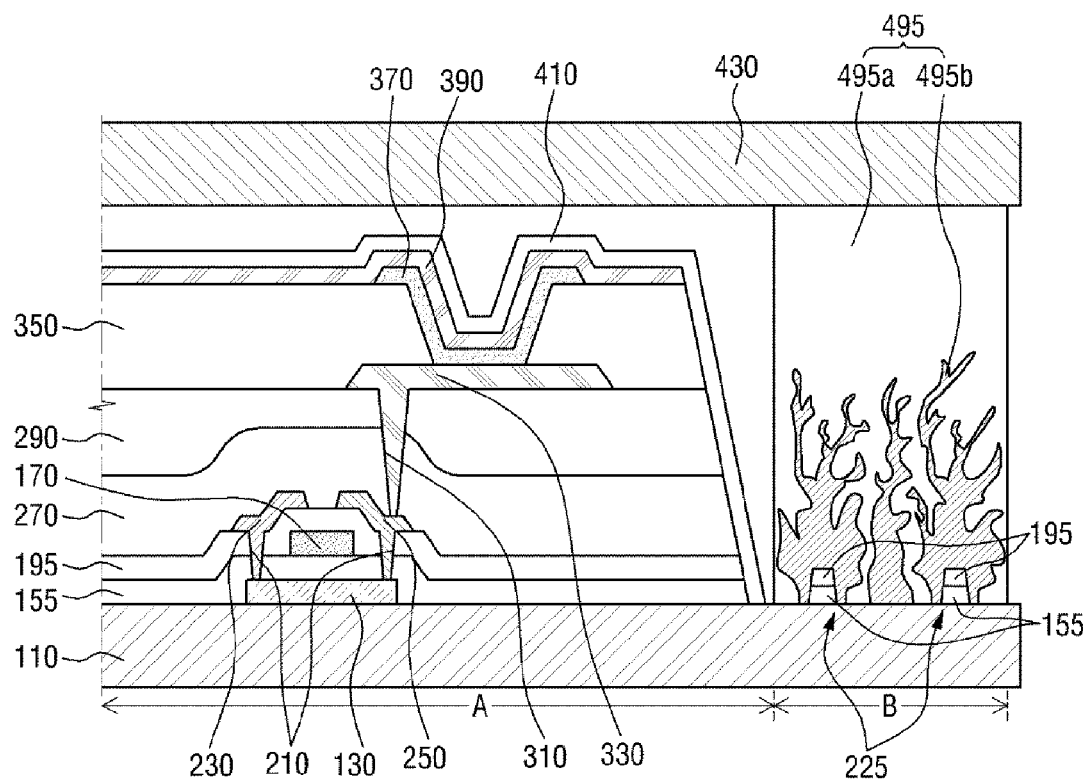
FIG. 19 is a cross-sectional view of an OLED according to another embodiment of the present disclosure.

An OLED according to another embodiment of the present disclosure will now be described with reference to FIG. 19. FIG. 19 is a cross-sectional view of an OLED according to another embodiment of the present disclosure. For simplicity, elements substantially identical to those of FIG. 1 are indicated by like reference numerals, and thus, a redundant description thereof will be omitted.

Referring to FIG. 19, the OLED according to the current embodiment may include insulating layer patterns 225. Specifically, one or more insulating layer patterns 225, each composed of a gate insulating layer 155 and an interlayer insulating film 195, may be disposed on an encapsulation region B of a first substrate 110. Here, the insulating layer patterns 225 may be protruding patterns that protrude upward from the first substrate 110.

A spread start point of a second encapsulant 495b may not only be surfaces of the insulating layer patterns 225 but also part of a surface of the first substrate 110. That is, an encapsulant 495 may include a first encapsulant 495a and the second encapsulant 495b located within the first encapsulant 495a as described above. The spread start point of the second encapsulant 495b may be the surfaces of the insulating layer patterns 225 and part of the surface of the first substrate 110. Here, part of the surface of the first substrate 110, which is the spread start point, may be located between the insulating layer patterns 225. The second encapsulant 495b may spread randomly in a direction away from the surfaces of the insulating layer patterns 225 and part of the surface of the first substrate 110.

In the OLED according to the current embodiment, the spread start point of the second encapsulant 495b is set to the surfaces of the insulating layer patterns 225 and the surface of the first substrate 110. Therefore, mechanical strength of the encapsulant 495 can be improved further.

Figure 20:
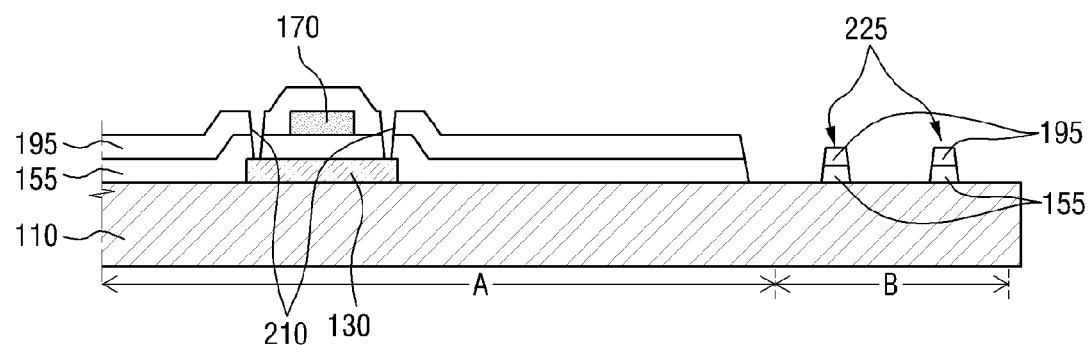
FIG. 20 is a cross-sectional view illustrating forming insulating layer patterns during manufacturing the OLED of FIG. 19.
Figure 21:
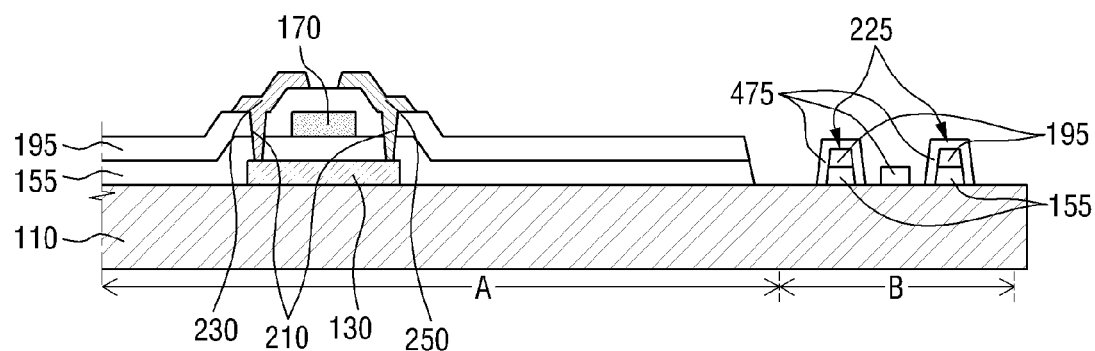
FIG. 21 is a cross-sectional view illustrating forming metal patterns during manufacturing the OLED of FIG. 19.
Figure 22:
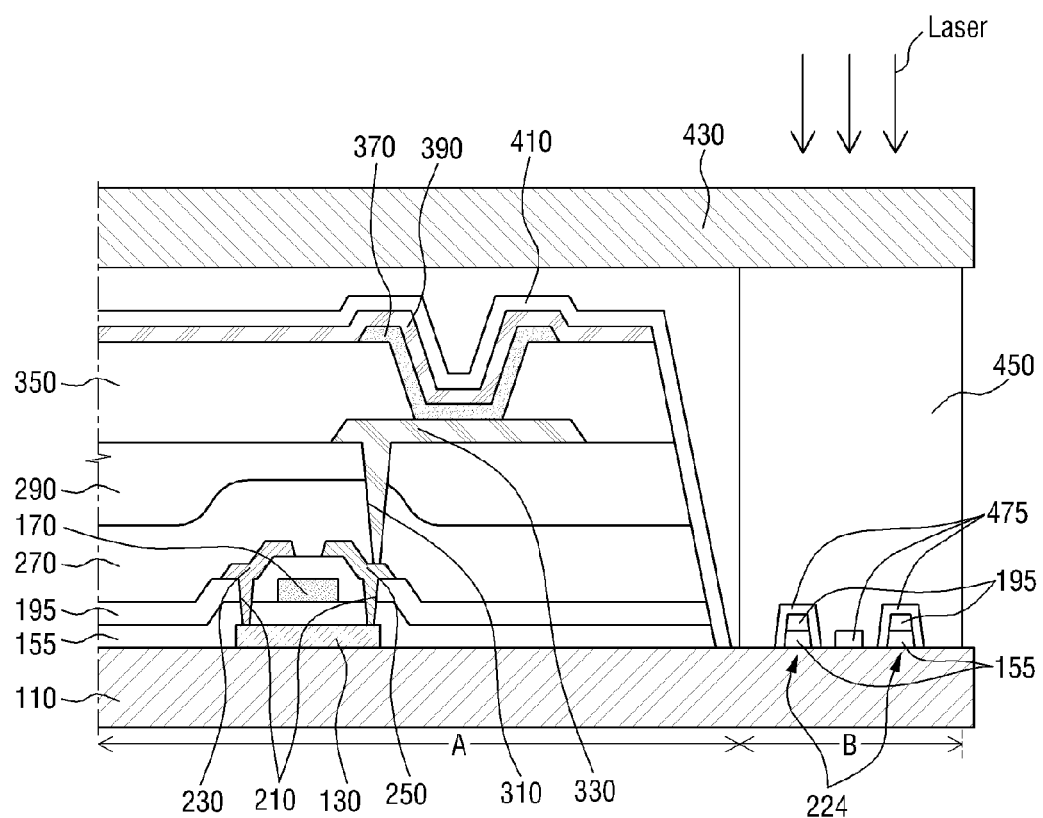
FIG. 22 is a cross-sectional view illustrating encapsulating an organic light-emitting element during manufacturing the OLED of FIG. 19.

A method of manufacturing an OLED according to another embodiment of the present disclosure will now be described with reference to FIGS. 20 through 22. FIG. 20 is a cross-sectional view illustrating an operation of forming insulating layer patterns 225 during a process of manufacturing the OLED of FIG. 19. FIG. 21 is a cross-sectional view illustrating an operation of forming metal patterns 475 during the process of manufacturing the OLED of FIG. 19. FIG. 22 is a cross-sectional view illustrating an operation of encapsulating an organic light-emitting element during the process of manufacturing the OLED of FIG. 19. For simplicity, elements substantially identical to those of FIGS. 1 through 7 are indicated by like reference numerals, and thus, a redundant description thereof will be omitted.

Referring to FIG. 20, a semiconductor pattern 130, a gate insulating layer 155, a gate electrode 170, an interlayer insulating film 195, contact holes 210, and the insulating layer patterns 225 may be formed on a first substrate 110. After the formation of the semiconductor pattern 130, the gate insulating layer 155, the gate electrode 170 and the interlayer insulating film 195, the contact holes 210 and the insulating layer patterns 225 may be formed simultaneously on an element region A and an encapsulation region B, respectively, by using a typical etching process. The insulating layer patterns 225 may protrude upward from the first substrate 110. The contact holes 210 and the insulating layer patterns 225 may be formed using a single mask. In some embodiments, a gap between the insulating layer patterns 225 may be large enough to accommodate the metal patterns 475, which are generally formed later in the process.

Referring to FIG. 21, after the formation of the semiconductor pattern 130, the gate insulating layer 155, the gate electrode 170, the interlayer insulating film 195, the contact holes 210 and the insulating layer patterns 225 on the first substrate 110, a source electrode 230, a drain electrode 250, and the metal patterns 475 may be formed. Specifically, the source electrode 230 and the drain electrode 250 may be inserted into the contact holes 210, and the metal patterns 475 may be formed on surfaces of the insulating layer patterns 225 and on the first substrate 110 between the insulating layer patterns 225.

Referring to FIG. 22, after the formation of the source electrode 230, the drain electrode 250 and the metal patterns 475, an intermediate layer 270, a planarization layer 290, a via hole 310, a first electrode 330, a pixel defining layer 350, an organic light-emitting layer 370, a second electrode 390, and a passivation layer 410 may be formed on the source electrode 230 and the drain electrode 250. Then, the organic light-emitting element may be encapsulated by bonding the glass frit pattern 450 of the structure shown in FIG. 3 and the metal patterns 475. To encapsulate the organic light-emitting element more perfectly, the metal patterns 475 may be spread into the glass frit pattern 450 by irradiating laser beams to the metal patterns 475. The process of FIG. 22 may produce the OLED according to the embodiment of FIG. 19.

Figure 23:
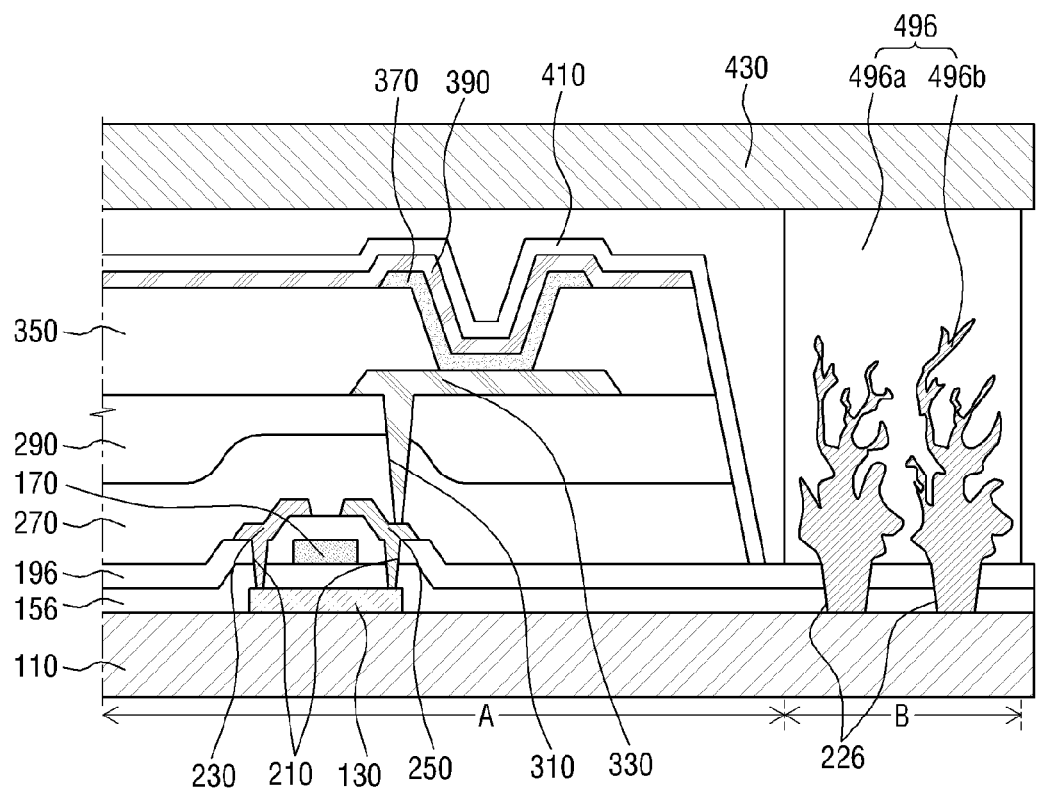
FIG. 23 is a cross-sectional view of an OLED according to another embodiment of the present disclosure.

An OLED according to another embodiment of the present disclosure will now be described with reference to FIG. 23. FIG. 23 is a cross-sectional view of an OLED according to another embodiment of the present disclosure. For simplicity, elements substantially identical to those of FIG. 1 are indicated by like reference numerals, and thus, a redundant description thereof will be omitted.

Referring to FIG. 23, the OLED according to the current embodiment may include insulating layer patterns 226. Specifically, one or more insulating layer patterns 226 may be formed on an encapsulation region B of a first substrate 110 by patterning a gate insulating layer 156 and an interlayer insulating layer 196. Here, the insulating layer patterns 226 may be depressed patterns that are depressed toward the first substrate 110.

An encapsulant 496 may include a first encapsulant 496a and a second encapsulant 496b located within the first encapsulant 496a as described above. A spread start point of the second encapsulant 496b may be surfaces of the insulating layer patterns 226. That is, the second encapsulant 496b may spread randomly in a direction away from side and bottom surfaces of the insulating layer patterns 226. Here, the side surfaces of the insulating layer patterns 226 may be composed of respective surfaces of the gate insulating layer 165 and the interlayer insulating layer 196, and the bottom surfaces of the insulating layer patterns 226 may be composed of a surface of the first substrate 110.

In the OLED according to the current embodiment, the spread start point of the second encapsulant 496b is set to the surfaces of the insulating layer patterns 226. This increases the adhesion area of the second encapsulant 496b, which further improves mechanical strength of the encapsulant 496.

Figure 24:
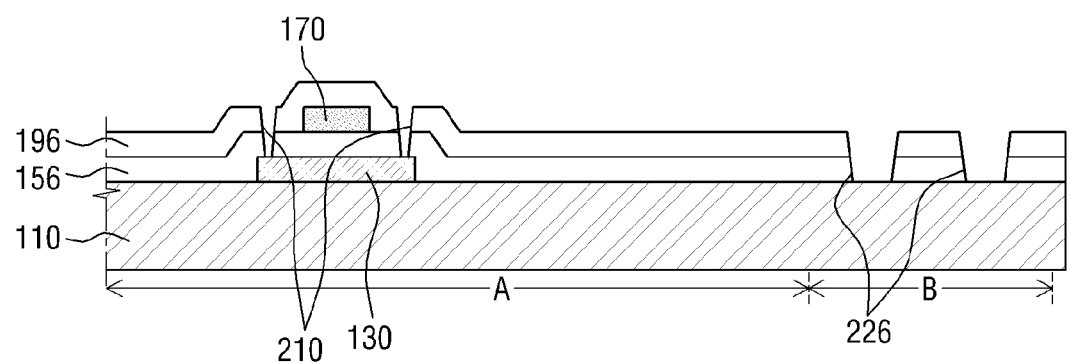
FIG. 24 is a cross-sectional view illustrating forming insulating layer patterns during manufacturing the OLED of FIG. 23.
Figure 25:
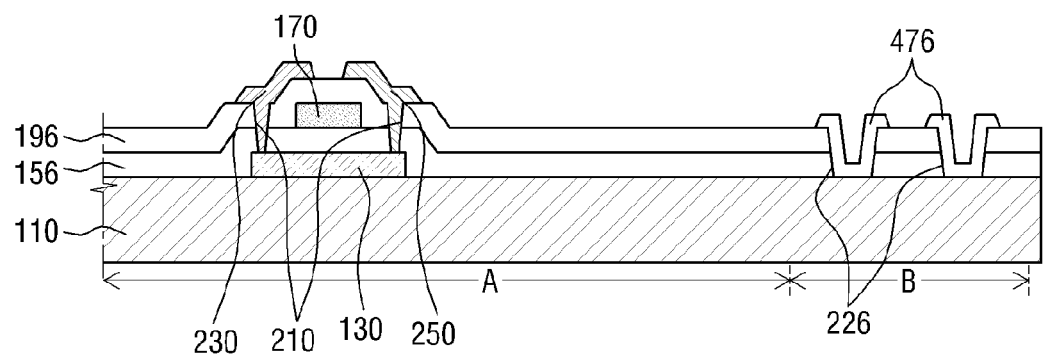
FIG. 25 is a cross-sectional view illustrating forming metal patterns during manufacturing the OLED of FIG. 23.
Figure 26:
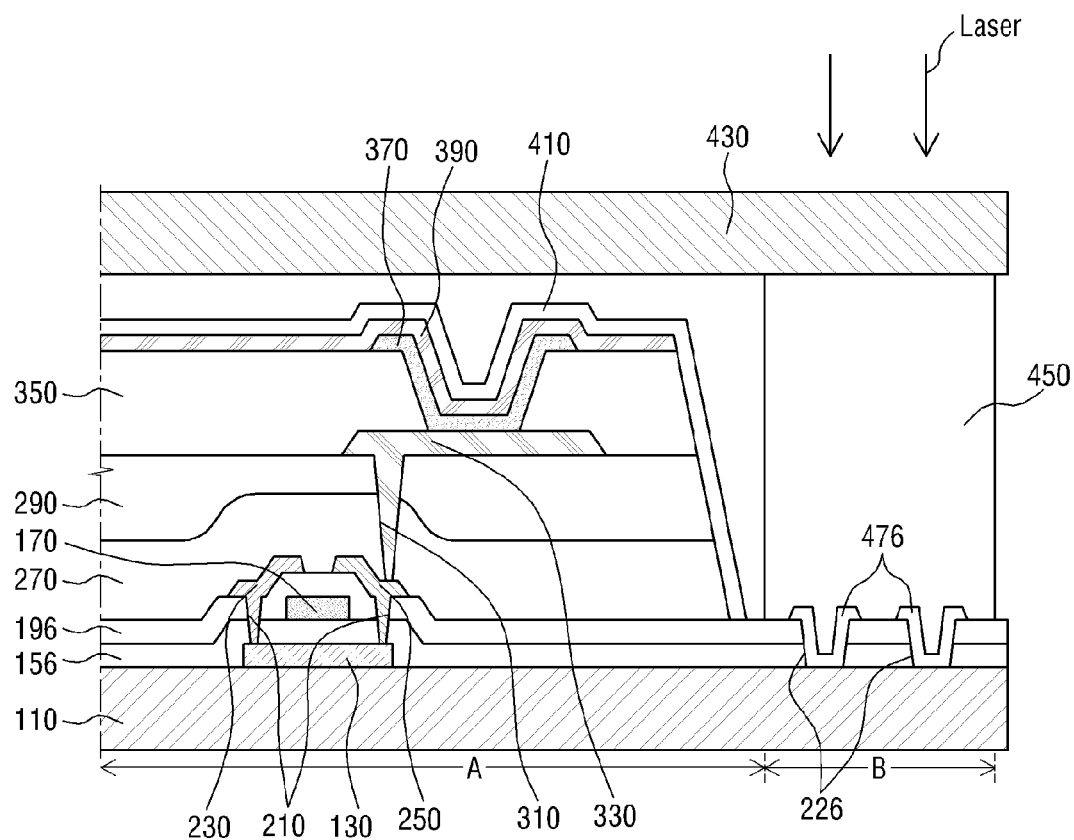
FIG. 26 is a cross-sectional view illustrating encapsulating an organic light-emitting element during manufacturing the OLED of FIG. 23.

A method of manufacturing an OLED according to another embodiment of the present disclosure will now be described with reference to FIGS. 24 through 26. FIG. 24 is a cross-sectional view illustrating an operation of forming insulating layer patterns 226 during a process of manufacturing the OLED of FIG. 23. FIG. 25 is a cross-sectional view illustrating an operation of forming metal patterns 476 during the process of manufacturing the OLED of FIG. 23. FIG. 26 is a cross-sectional view illustrating an operation of encapsulating an organic light-emitting element during the process of manufacturing the OLED of FIG. 23. For simplicity, elements substantially identical to those of FIGS. 1 through 7 are indicated by like reference numerals, and thus, a redundant description thereof will be omitted.

Referring to FIG. 24, a semiconductor pattern 130, a gate insulating layer 156, a gate electrode 170, an interlayer insulating film 196, contact holes 210, and the insulating layer patterns 226 may be formed on a first substrate 110. After the formation of the semiconductor pattern 130, the gate insulating layer 156, the gate electrode 170 and the interlayer insulating film 196, the contact holes 210 and the insulating layer patterns 226 may be formed simultaneously on an element region A and an encapsulation region B, respectively, by using a typical etching process. The insulating layer patterns 226 may be depressed toward the first substrate 110. The contact holes 210 and the insulating layer patterns 226 may be formed using a single mask.

Referring to FIG. 25, after the formation of the semiconductor pattern 130, the gate insulating layer 155, the gate electrode 170, the interlayer insulating film 196, the contact holes 210 and the insulating layer patterns 226 on the first substrate 110, a source electrode 230, a drain electrode 250, and the metal patterns 476 may be formed. Specifically, the source electrode 230 and the drain electrode 250 may be inserted into the contact holes 210, and the metal patterns 476 may be formed to cover both side and bottom surfaces of the insulating layer patterns 226. Here, cross-sections of the metal patterns 476 may be U-shaped.

Referring to FIG. 26, after the formation of the source electrode 230, the drain electrode 250 and the metal patterns 476, an intermediate layer 270, a planarization layer 290, a via hole 310, a first electrode 330, a pixel defining layer 350, an organic light-emitting layer 370, a second electrode 390, and a passivation layer 410 may be formed on the source electrode 230 and the drain electrode 250. Then, the organic light-emitting element may be encapsulated by bonding the glass frit pattern 450 of the structure shown in FIG. 3 and the metal patterns 476. To encapsulate the organic light-emitting element more perfectly, the metal patterns 476 may be spread into the glass frit pattern 450 by irradiating laser beams to the metal patterns 476. The process of FIG. 26 may produce the OLED according to the embodiment of FIG. 23.

Embodiments of the present disclosure provide at least one of the following advantages:

First, consistent display quality and impact resistance of an OLED can be ensured by improving the overall mechanical strength of an encapsulant.

Second, an OLED with consistent display quality and impact resistance can be manufactured using a very efficient process.

However, the effects of the present disclosure are not restricted to the one set forth herein. The above and other effects of the present disclosure will become more apparent to one of daily skill in the art to which the present disclosure pertains by referencing the claims.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. An organic light-emitting display device (OLED), comprising:
   a first substrate having an element region and an encapsulation region surrounding the element region;
   a second substrate facing the first substrate;
   an organic light-emitting element interposed between the first substrate and the second substrate and formed in the element region; and
   an encapsulant interposed between the first substrate and the second substrate and formed in the encapsulation region,
   wherein the encapsulant comprises a first encapsulant and a second encapsulant, the second encapsulant formed within the first encapsulant and adjacent to at least one of the first substrate and the second substrate, and
   wherein a volume ratio of the second encapsulant to the first encapsulant increases in a first direction from the second substrate towards the first substrate or in a second direction from the first substrate towards the second substrate.

2. The OLED of claim 1, wherein the first encapsulant is formed of glass frit, and the second encapsulant is formed of a metallic material.

3. The OLED of claim 2, wherein the second encapsulant is formed of at least one of aluminum and silver.

4. The OLED of claim 2, wherein a melting point of the metallic material is less than about 1000° C.

5. The OLED of claim 1, wherein the second encapsulant is formed in a shape spreading randomly in a direction away from the first substrate or the second substrate.

6. The OLED of claim 1, further comprising a thin-film transistor (TFT) interposed between the first substrate and the second substrate and formed in the element region, wherein the TFT comprises a gate electrode, a source electrode and a drain electrode, and wherein the second encapsulant is formed of the same material as at least one of the gate electrode, the source electrode and the drain electrode.

7. The OLED of claim 1, further comprising at least one insulating layer formed on the first substrate, wherein the encapsulant is interposed between the insulating layer and the second substrate.

8. The OLED of claim 7, wherein the insulating layer comprises at least one insulating layer pattern formed in the encapsulation region, wherein the insulating layer pattern is at least one of a protruding pattern and a depressed pattern.

9. The OLED of claim 8, wherein the second encapsulant is formed in a shape spreading randomly in a direction away from the insulating layer pattern.

10. The OLED of claim 2, wherein the second encapsulant is formed of silver.

* * * * *